(12) United States Patent
Hu et al.

(10) Patent No.: US 10,290,774 B2
(45) Date of Patent: *May 14, 2019

(54) WEARABLE DISPLAY HAVING AN ARRAY OF LEDS ON A CONFORMABLE SILICON SUBSTRATE

(71) Applicant: Apple Inc., Cupertino, CA (US)

(72) Inventors: Hsin-Hua Hu, Los Altos, CA (US); Andreas Bibl, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 232 days.

This patent is subject to a terminal disclaimer.

(21) Appl. No.: 15/299,346

(22) Filed: Oct. 20, 2016

(65) Prior Publication Data
US 2017/0092627 A1    Mar. 30, 2017

Related U.S. Application Data

(63) Continuation of application No. 14/563,772, filed on Dec. 8, 2014, now Pat. No. 9,478,583.

(51) Int. Cl.
| | |
|---|---|
| *H01L 33/48* | (2010.01) |
| *H01L 27/15* | (2006.01) |
| *H01L 33/62* | (2010.01) |
| *H01L 51/00* | (2006.01) |
| *H01L 25/075* | (2006.01) |
| *H01L 33/44* | (2010.01) |

(52) U.S. Cl.
CPC ........ *H01L 33/486* (2013.01); *H01L 25/0753* (2013.01); *H01L 27/156* (2013.01); *H01L 33/44* (2013.01); *H01L 33/62* (2013.01); *H01L 51/0097* (2013.01); *H01L 2224/24* (2013.01); *H01L 2251/5338* (2013.01); *H01L 2933/0025* (2013.01); *H01L 2933/0033* (2013.01); *H01L 2933/0066* (2013.01); *Y02E 10/549* (2013.01); *Y02P 70/521* (2015.11)

(58) Field of Classification Search
CPC ..... H01L 25/0753; H01L 33/62; H01L 33/44; H01L 33/486
See application file for complete search history.

(56) References Cited

U.S. PATENT DOCUMENTS

| | | | | |
|---|---|---|---|---|
| 9,478,583 | B2* | 10/2016 | Hu | H01L 27/156 |
| 9,666,764 | B2* | 5/2017 | Bergmann | H01L 33/0079 |
| 2010/0241795 | A1* | 9/2010 | Kudo | G11C 16/10 |
| | | | | 711/103 |
| 2013/0099276 | A1* | 4/2013 | Fukushima | H01L 33/46 |
| | | | | 257/99 |
| 2013/0210194 | A1* | 8/2013 | Bibl | H01L 24/83 |
| | | | | 438/107 |

(Continued)

*Primary Examiner* — Michael Jung
(74) *Attorney, Agent, or Firm* — David K. Cole

(57) ABSTRACT

A conformable electronic device and methods for forming such devices are described. Embodiments of a conformable electronic device may include a silicon substrate having a thickness of 50 μm or less. An array of LEDs that are electrically coupled to a controller chip may be formed on a surface of the silicon substrate. In an embodiment, a top passivation layer is formed over the array of LEDs, the one or more controller chips, and the top surface of the silicon substrate. An embodiment also includes a bottom passivation layer formed on a bottom surface of the silicon substrate.

20 Claims, 25 Drawing Sheets

(56) References Cited

U.S. PATENT DOCUMENTS

2014/0264410 A1* 9/2014 Lin ..................... H01L 25/167
                                                    257/98
2015/0348906 A1* 12/2015 Park ..................... H01L 33/486
                                                    257/774

* cited by examiner

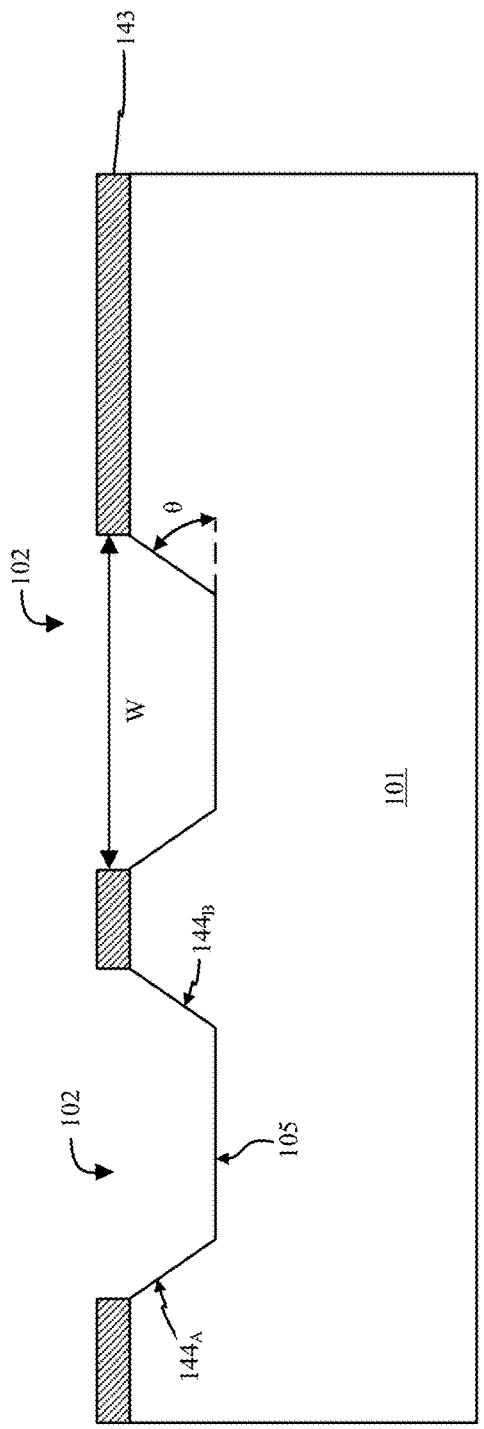
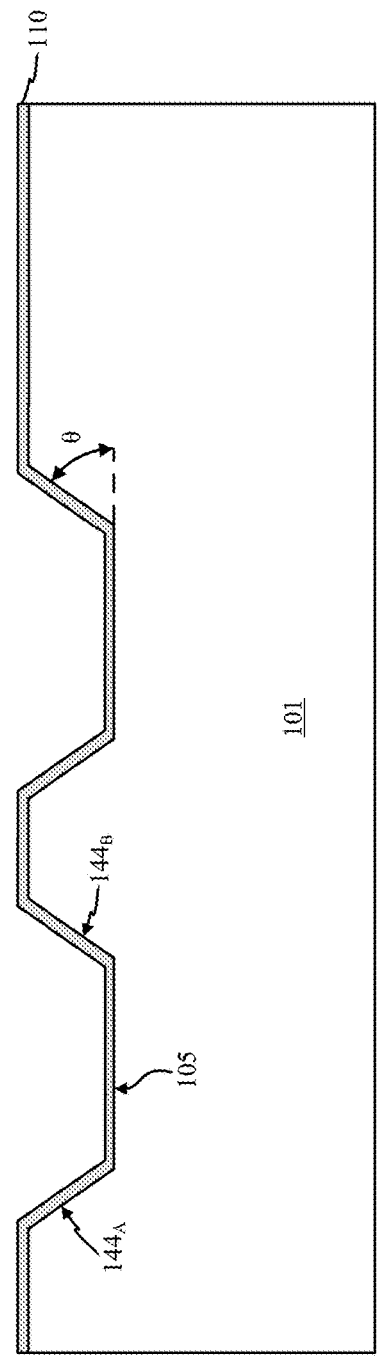
FIG. 2
FIG. 3

WEARABLE DISPLAY HAVING AN ARRAY OF LEDS ON A CONFORMABLE SILICON SUBSTRATE

RELATED APPLICATION(S)

This application is a continuation application of co-pending U.S. patent application Ser. No. 14/563,772, filed on Dec. 8, 2014, which is incorporated herein by reference.

BACKGROUND

Field

Embodiments relate to conformable electronic devices. More particularly embodiments relate conformable light emitting diode displays.

Background Information

Flexible display technology can potentially be used in a variety of electronic devices such as rollable displays, irregularly shaped displays, and wearable displays. The flexibility of the electronic device is at least partially limited by the substrate on which the display is formed. Several flexible displays have been developed using thin glass or plastic as a flexible substrate onto which low-temperature polycrystalline silicon thin-film transistors (TFTs) are formed.

SUMMARY

Embodiments describe conformable electronic devices, packages, and methods of formation. The conformable electronic devices may be integrated with a variety of applications and products, ranging from textile products (e.g. as a wearable display) to product packaging materials (e.g. shrink wrapping). In an embodiment a conformable electronic device includes a silicon substrate with a thickness of 50 μm or less. In an embodiment, the silicon substrate has a maximum thickness between 5 and 20 μm. An array of LED and an array of controller chips are bonded to a first side of the silicon substrate, with each LED being electrically coupled to a controller chip. A first passivation layer is formed over the array of LEDs and the array of controller chips on the first side of the silicon substrate. A second passivation layer is formed over a second side of the silicon substrate opposite to the first side of the silicon substrate. In an embodiment, the silicon substrate is sufficiently thin to exhibit conformable behavior. One or both of the passivation layers may be transparent to the visible wavelength spectrum. The first and second passivation layers may be formed of the same or different materials. In an embodiment, the silicon substrate is at or close to a neutral (strain) axis in a conformable electronic package. In such a configuration, where the conformable electronic package is rolled or bent, one surface is under tensile strain while the opposite surface is under compressive strain. Location of the neutral (strain) axis may be determined by thickness and material properties of the layers within the conformable electronic package.

In an embodiment the LEDs are bonded to the first side of the silicon substrate within an array of bank structures formed in the silicon substrate. Each controller chip may include a driving circuit to switch and drive one or more of the LEDs. Each controller chip may control or ore more pixels. The array of LEDs and array of controller chips may additionally be located within a display area of the conformable device. Size of the LEDs and controller chips may additionally be scaled with resolution and pixels per inch (PPI) for a display area. For example, the LEDs may be arranged in a plurality of pixels with a density of 40 PPI or greater. In an embodiment, the controller chips and LEDs each of a maximum length and width dimension of 1 to 300 μm.

A variety of configurations are disclosed for integrating the conformal electronic devices into conformable packages. In an embodiment, a driver ledge is formed around the display area. In this configuration on or more display components may be bonded to the silicon substrate on the driver ledge and electrically coupled to one or more of the controller chips. In an embodiment, on or more vias are formed through the silicon substrate. In this configuration, the one or more vias electrically couple one or more of the controller chips to the second side of the silicon substrate opposite the first side of the silicon substrate where one or more display components are bonded and electrically coupled to the one or more controller chips.

In an embodiment, forming a conformable electronic device includes forming conductive paths over a silicon substrate, bonding an array of LEDs to the conductive paths, bonding an array of controller chips to the conductive paths, forming a first passivation layer over a first side of the silicon substrate, reducing a maximum thickness of the silicon substrate to less than 50 μm, and forming a second passivation layer over a second side of the silicon substrate opposite the first side. Bonding the array of LEDs to the conductive paths may include picking of the array of LEDs from a carrier substrate with an electrostatic transfer head assembly supporting an array of electrostatic transfer heads, contacting the silicon substrate with the array of LEDs, transferring thermal energy from the array of electrostatic transfer head assembly to bond the array of LEDs to the conductive paths on the silicon substrate, and releasing the array of LEDs onto the silicon substrate. In an embodiment, a sidewall passivation layer is ink jetted along sidewall surfaces of the LEDs after bonding the LEDs to the conductive paths on the silicon substrate. In an embodiment, reducing a maximum thickness of the silicon substrate includes removing a bulk silicon layer from a silicon on insulator (SOI) substrate. In an embodiment, reducing the maximum thickness of the silicon substrate comprises exposing a plurality of vias in the silicon substrate.

BRIEF DESCRIPTION OF THE DRAWINGS

FIGS. 1A-7 are cross-sectional side view illustrations of conformable electronic devices in accordance with embodiments during various processing operations.

DETAILED DESCRIPTION

Figure 1A:
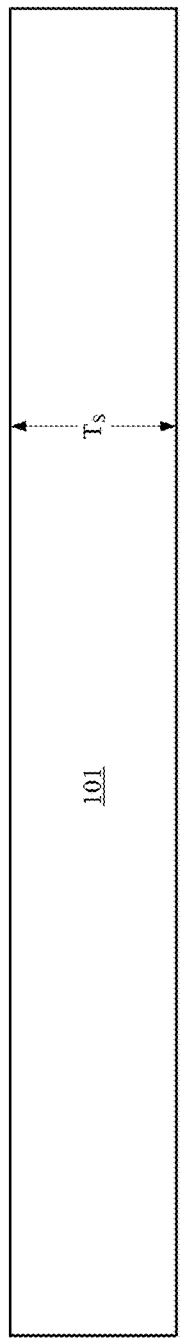

Embodiments describe conformable electronic devices, packages, and methods of forming such devices and packages. In an embodiment, a conformable electronic device includes a silicon substrate having a thickness of 50 μm or less. An array of light emitting diodes (LEDs) and an array of controller chips are bonded to a first side of the silicon substrate with each LED electrically coupled to a controller chip. In an embodiment, a first passivation layer is formed over the array of LEDs, the array of controller chips, and the first side of the silicon substrate. In an embodiment, the LEDs are micro LEDs. In an embodiment, the controller chips are micro controller chips. The controller chips include one or more driving circuits to switch and drive one or more of the LEDs. In an embodiment, a method of forming a conformable electronic device includes forming a conductive layer over a silicon substrate. An array of LEDs and an array of controller chips are bonded to the silicon substrate, with the conductive layer electrically coupling each LED to one of the controller chips. A first passivation layer is formed over a first side of the silicon substrate. In an embodiment, the thickness of the silicon substrate is reduced to less than 50 μm.

Depending on its thickness, a silicon substrate can be either a rigid substrate or a conformable substrate. Silicon substrates, such as commercially available silicon wafers that are approximately 100 μm or greater are rigid substrates that are suitable for typical semiconductor fabrication processes. As the thickness of a silicon substrate is reduced to approximately 50 μm, the substrate will begin to transform into a conformable substrate. In one aspect, methods for forming a conformable electronic device utilize silicon substrates that have thicknesses approximately equal to those of commercially available silicon wafers in order to provide a substrate that is rigid during the fabrication process. According to an embodiment, the thickness of the silicon substrate is reduced to less than approximately 50 μm subsequent to various process operations once the rigid behavior of the substrate is no longer needed. In another aspect, a silicon substrate is able to withstand high temperature processing techniques (e.g., deposition of various layers, oxide growth, and annealing) that may be utilized during the fabrication of a conformable electronic device. Furthermore, a silicon substrate is easily oxidizable, for example, to condition the surface for improved adhesion of subsequent layers or for forming electrically insulating layers. Silicon substrates are also amenable to patterning processes at high resolutions.

In an embodiment, an array of LEDs and an array of controller chips are transferred onto the silicon substrate by transfer head assemblies operating using electrostatic principles to pick up and transfer arrays of LEDs and arrays of controller chips. Electrostatic transfer enables the driving circuitry to be located on the front surface of the conformable electronic device, rather than embedded within the conformable electronic device. Commercially available silicon wafers have a highly planar surface. A planar surface ensures that the bonding process can be implemented with each LED in an array of LEDs contacting the substrate simultaneously. Furthermore, a rigid silicon substrate can withstand the pressures exerted on the substrate during the bonding process without deforming.

The terms "micro" device, "micro" LED, or "micro" controller chip as used herein may refer to the descriptive size of certain devices, devices, or structures in accordance with embodiments. As used herein, the terms "micro" devices or structures are meant to refer to the scale of 1 to 300 μm. However, it is to be appreciated that embodiments are not necessarily so limited, and that certain aspects of the embodiments may be applicable to larger, and possibly smaller size scales. In an embodiment, a single micro LED in an array of micro LEDs may have a maximum dimension, for example length or width, of 1 to 300 μm. In an embodiment, the top contact surface of each micro LED has a maximum dimension of 1 to 300 μm, or more specifically 3 to 20 μm. In an embodiment, the controller chips have a maximum length or width, of 1 to 300 μm. For example, where the controller chips are placed between pixels, the maximum length or width may be determined by the resolution, or pixels per inch, in the display area.

In accordance with some embodiments, the conformable electronic device described herein is an active matrix display formed with inorganic semiconductor-based micro LEDs. An exemplary micro LED active matrix display utilizes the performance, efficiency, and reliability of inorganic semiconductor-based LEDs for emitting light. Furthermore, a micro LED active matrix display panel enables a display panel to achieve high resolutions, pixel densities, and subpixel densities due to the small size of the micro LEDs and micro controller chips. In some embodiments, the high resolutions, pixel densities, and subpixel densities are achieved due to the small size of the micro LEDs and micro controller chips. For example, a 55 inch interactive television panel with 1920×1080 resolution, and 40 pixels per inch (PPI) has an approximate red, green, blue (RGB) pixel pitch of (634 μm×643 μm) and subpixel pitch of (211 μm×634 μm). In this manner, each subpixel contains one or more micro LEDs having a maximum width of no more than 211 μm. Furthermore, where real estate is reserved for controller chips in addition to micro LEDs, the size of the micro LEDs may be further reduced. For example, a 5 inch interactive display panel with 1920×1080 resolution, and 440 PPI has an approximate RGB pixel pitch of (58 μm×58 μm) and subpixel pitch (19 μm×58 μm). In such an embodiment, not only does each subpixel contain one or more micro LEDs having a maximum width of no more than 19 μm, in order to not disturb the pixel arrangement, each controller chip may additionally be reduced below the pixel pitch of 58

µm. Controller chips may also be arranged between sub-pixels or pixels. For example, controller chips may be characterized with a length greater than the pitch between sub-pixels or pixels, and a width less than the pitch between sub-pixels. Power efficiency of micro LEDs is higher with inorganic-based semiconductors compared to the power efficiency of currently available organic-based semiconductors, and as such, may be more scalable with PPI. Accordingly, some embodiments combine with efficiencies of inorganic semiconductor-based LEDs for emitting light with the scalability of inorganic semiconductor-based LEDs, and optionally controller chips, to the micro scale for implementation into high resolution and pixel density applications.

In an embodiment, an array of bonding pads is formed on the front surface of the silicon substrate outside of the display area on a driver ledge. The bonding pads are electrically coupled to the array of controller chips on the front surface of the conformable electronic device. In an embodiment, the display components are bonded to the bonding pads formed outside the display area. Alternatively, the display components are bonded to a second substrate that is electrically coupled to the one or more of the bonding pads formed outside the display area with a flexible printed circuit (FPC). The plurality of display components can include, but are not limited to, scan drivers, data drivers, sense controllers, write controllers, microcontrollers, and power supplies. In an embodiment driver chips (e.g. data drivers and/or scan drivers) are bonded to the bonding pads on the front surface of the substrate outside of the display area, and other display components are bonded to a circuit board attached to the driver ledge of the substrate with a FPC.

In an embodiment, a conformable electronic device includes a conformable silicon substrate and a conformable build-up structure formed on the backside of the conformable silicon substrate. The conformable build-up structure has one or more layers of conductive material formed therein. The conformal build-up structure may also optionally have one or more layers of insulating material. In an embodiment, the build-up structure is a single redistribution layer comprising conductive material formed on the backside of the conformable silicon substrate. One or more conductive vias are formed through the silicon substrate to provide electrical connections from the backside of the conformable semiconductor substrate to the front side of the conformable semiconductor substrate. In an embodiment, the layer of conductive material formed in the conformable build-up structure electrically couples bonding pads formed on a back surface of the build-up structure to the array of controller chips. In an additional embodiment, the conductive material formed in a single redistribution layer electrically couples bonding pads formed on a back surface of the redistribution layer to the array of controller chips. In embodiments, display components are bonded to the bonding pads on the back of the build-up structure or the single redistribution layer and below a display area of the conformable electronic device. In another embodiment, bond pads are formed on a front surface of the display area.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. Reference throughout this specification to "one embodiment," "an embodiment" or the like means that a particular feature, structure, configuration, or characteristic described in connection with the embodiment is included in at least one embodiment. Thus, the appearances of the phrase "in one embodiment," "an embodiment" or the like in various places throughout this specification are not necessarily referring to the same embodiment. Furthermore, the particular features, structures, configurations, or characteristics may be combined in any suitable manner in one or more embodiments.

The terms "over", "to", "between", and "on" as used herein may refer to a relative position of one layer with respect to other layers. One layer "over", or "on" another layer or bonded "to" another layer may be directly in contact with the other layer or may have one or more intervening layers. One layer "between" layers may be directly in contact with the layers or may have one or more intervening layers.

FIG. 1A is a cross-sectional view of a substrate 101 according to an embodiment. According to embodiments, substrate 101 is a material that is capable of demonstrating both rigid behavior and conformable behavior. According to an embodiment, a conformable electronic device has enough flexibility to be flexed, bent, and/or rolled one or more times without failing. By way of example, and not by way of limitation, the minimum radius of curvature may be less than 50 mm, or more specifically less than 30 mm. For example, this may correspond to a radius of curvature for a bracelet or wrist watch. Accordingly, substrate 101 is a material that has a rigid state and a flexible state with the degree of flexibility being determined in part by the thickness of the substrate 101. By way of example, and not by way of limitation, substrate 101 may be formed from a silicon substrate, such as a monocrystalline or polycrystalline silicon substrates. In a particular embodiment, the silicon substrate is a commercially available silicon wafer. As described above, silicon substrates that have a thickness greater than 50 µm (e.g. 100 µm and above) may exhibit rigid characteristics that are suitable for semiconductor fabrication processes. Accordingly, embodiments utilize a silicon substrate 101 that has a thickness $T_S$ greater than 50 µm (e.g. 100 µm and above) in order to provide a substrate that is rigid during the fabrication process. According to additional embodiments, silicon substrate 101 has a thickness $T_S$ of approximately 300 µm or greater in order to provide a more robust substrate that is less prone to fracturing than thinner substrates.

Figure 1B:
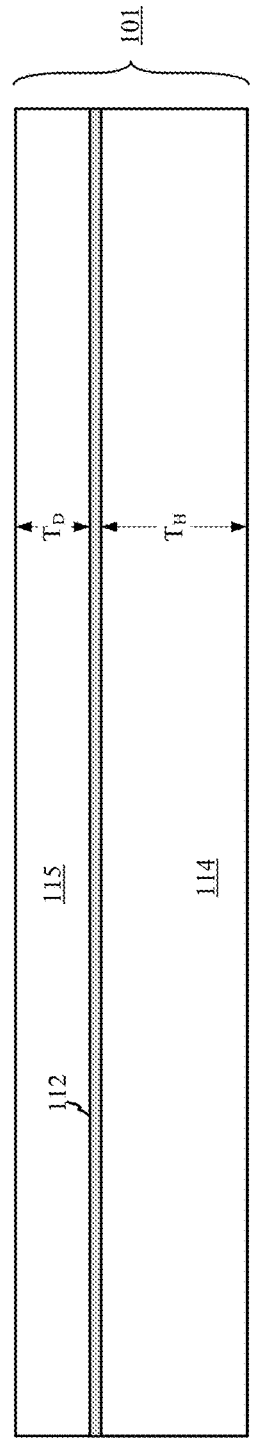

According to an embodiment illustrated in FIG. 1B, substrate 101 includes an uppermost silicon layer 115 that is separated from a bulk silicon layer 114 by a buried insulator layer 112. By way of example, substrate 101 may be a silicon on insulator (SOI) substrate. The thickness of the uppermost silicon layer 115 of the substrate 101 is chosen to have a thickness that is approximately equal to the final desired thickness of the conformable electronic device $T_D$. In such embodiments, the uppermost silicon layer 115 may have a thickness $T_D$ that is less than 50 µm. For example, the thickness $T_D$ of the uppermost silicon layer 115 may be between approximately 5 µm and 20 µm. The rigidity needed during certain processing operations is provided by the bulk silicon layer 114. As such, the thickness $T_H$ of the bulk silicon layer 114 is greater than 50 µm. According to additional embodiments, bulk silicon layer 114 has a thickness $T_H$ of approximately 300 µm or greater in order to provide a more robust substrate that is less prone to fracturing than thinner substrates.

Referring now to FIG. 2, an array of bank structures 102 are optionally etched into the top surface of the silicon substrate 101. Bank structures 102 comprise sidewalls $144_A$, sidewalls $144_B$, and a bottom surface 105. Bank structures 102 are sized to receive LEDs 145 and may correspond to a subpixel arrangement. For example, each subpixel may include a single bank structure 102. According to an embodiment, bank structures 102 are sized to receive LEDs 145, that have widths that are between approximately 1 μm and 300 μm, though the widths of both the bank structures and LEDs are scalable with PPI. For example, a bank structure 102 opening may be slightly less than the available subpixel area for a specific PPI. In an embodiment, bank structures 102 are sized to receive one or more LEDs 145. A mask 143 with a bank structure opening width W may be used to etch the bank structures 102. Mask 143 may be a hard or soft mask typically used in lithographic processes. By way of example, and not by way of limitation, mask 143 may be composed of a silicon nitride such as $SiN_x$ or an oxide, such as $SiO_2$. According to embodiments the width W of the opening of the bank structures 102 may be between approximately 1 μm and 400 μm, though the width W is scalable with PPI, and is larger than the width of the LEDs 145 integrated into the bank structures 102. The depth of the bank structures 102 may also be chosen to receive an LED 145. Furthermore, the depth of the bank structures 102 is dependent on the PPI of a display. According to an embodiment, a top surface of the LED 145 integrated in each bank structure 102 does not extend out of the bank structure. According to an additional embodiment, the top surface of the LED 145 is substantially coplanar with the top opening of the bank structure 102. According to yet another embodiment, the top surface of the LED 145 extends above the top opening of the bank structure 102. According to an embodiment, the bank structures 102 have a depth that is between approximately 0.5 μm and 10 μm.

As shown in FIG. 2, embodiments include bank structures 102 that have sidewalls $144_A$, $144_B$ that extend up from the bottom surface 105 of the bank structure at an angle θ. The angle θ of the sidewalls may be chosen to provide a structure that reflects light emitted from LEDs 145 in order to improve the light extraction efficiency of the conformable electronic device. According to such embodiments, the angle θ may be chosen such that it is between 30° and 70°. The angle θ may also be chosen in order to simplify processing. By way of example, and not by way of limitation, the angle θ may be chosen to be approximately 55°. An approximately 55° angle may be chosen when the silicon substrate 101 is a <100> silicon wafer. In such embodiments, an anisotropic wet etch, such as a wet etching chemistry comprising KOH, will selectively etch the (100) plane of the silicon to produce a characteristic V-etch. Etching the silicon substrate as such produces a bank structure 102 with sidewalls oriented at an angle θ of approximately 54.7°.

Referring now to FIG. 3, mask layer 143 is removed and an oxide layer 110 is formed over a top surface of the silicon substrate 101. The oxide layer 110 may also be formed over the exposed portions of the silicon substrate 101 that form the sidewalls $144_A$, $144_B$ and the bottom surface 105 of the bank structures 102. Oxide layer 110 provides a surface with improved adhesion strength to subsequent layers bonded to the silicon substrate, such as a passivation layer 160, compared to that of the surface of the silicon substrate 101. Additionally, an oxide layer 110 may be used to provide an electrically insulating layer over the silicon substrate 101. According to an embodiment, the oxide layer 110 is a silicon dioxide ($SiO_2$) layer. In an embodiment, the oxide layer 110 is thermally grown, such as with a wet oxidation process. The oxide layer 110 may also be deposited with a chemical vapor deposition process. By way of example, and not by way of limitation, the oxide layer 110 may be approximately 2 μm thick or less.

Figure 4A:
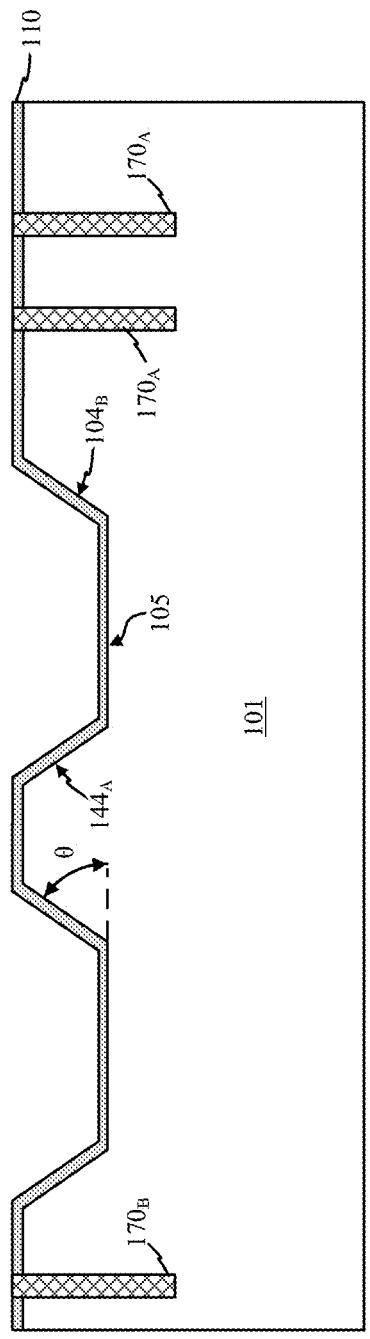
Figure 4B:
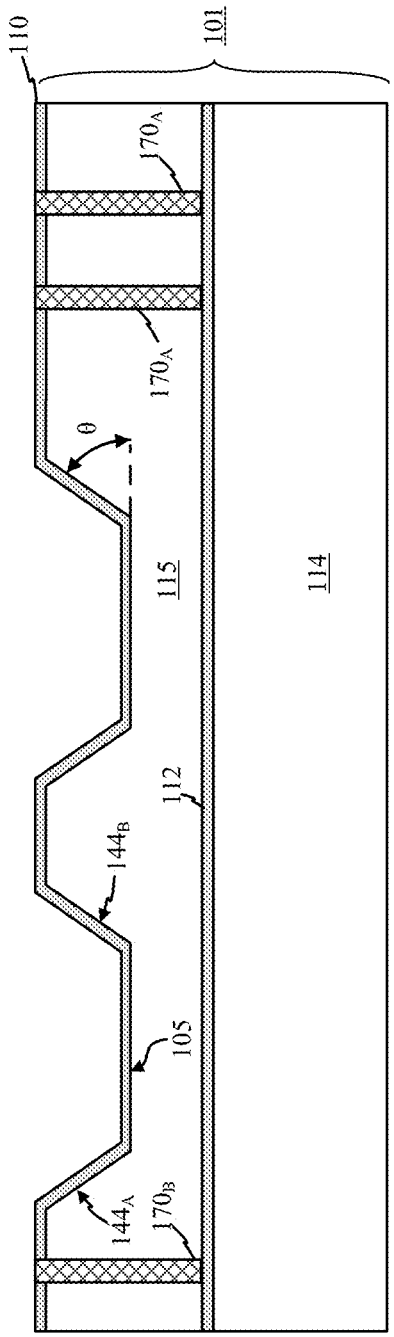

Referring now to FIG. 4A, an embodiment includes forming a plurality of vias $170_A$ and $170_B$ through the oxide layer 110 and into the silicon substrate 101 to a depth below the bottom surface 105 of the bank structures 102. Vias $170_A$ and $170_B$ are formed to a depth that will allow for an electrical connection to be made from the top surface of silicon substrate 101 to a back surface of the silicon substrate 101 subsequent to a thinning process (described below). For example, vias $170_A$ and $170_B$ are formed to a depth of approximately 50 μm into the substrate 101. In an embodiment vias $170_A$ and $170_B$ are formed with an anisotropic etching process known in the art, such as dry reactive ion etching (DRIE). A conductive material, such as copper, gold, or nickel, is deposited into vias $170_A$ and $170_B$ with a suitable process. For example, copper may be deposited into the vias $170_A$ and $170_B$ with electroless plating or sputtering. According to an embodiment shown in FIG. 4B, when the substrate 101 is a SOI substrate, such as the one described in FIG. 1B, vias $170_A$ and $170_B$ may be formed completely through the uppermost silicon substrate 115 and stop on the buried oxide 112. In another embodiment, vias $170_A$ and $170_B$ are formed completely through the buried oxide 112.

Figure 5A:
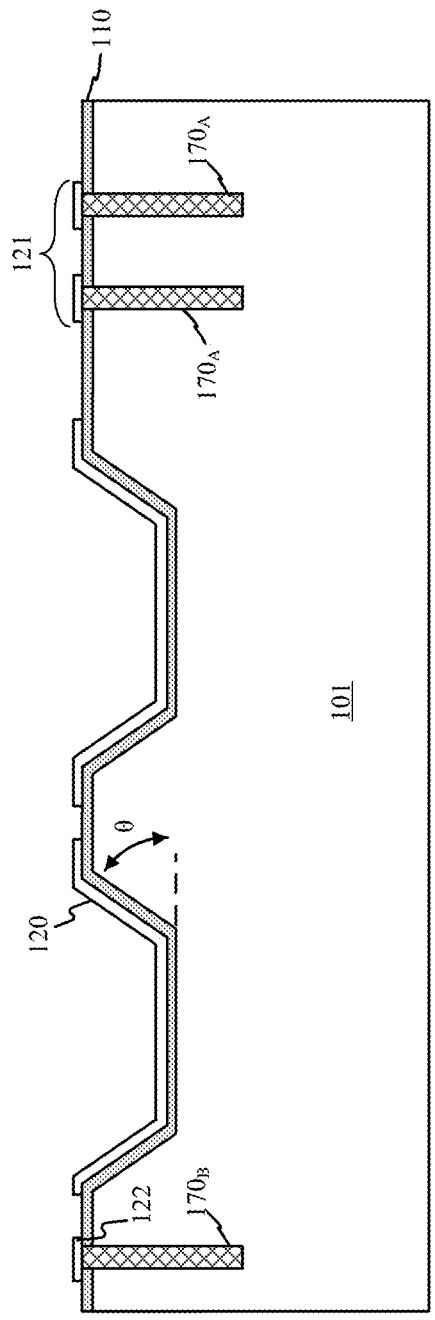

Referring now to FIG. 5A, a conductive layer is formed over the oxide layer 110 and patterned to form electrical paths. For example, the electrical paths may include contact lines 120 and contact pads 121, 122. In an embodiment, the electrical paths may be electrically coupled to one or more vias $170_A$ and $170_B$. According to embodiments, the conductive layer may be one or more layers of aluminum, molybdenum, titanium, titanium-tungsten, silver, or gold, or alloys thereof. Embodiments also include contact lines 120 and contact pads 121, 122 formed from conductive materials such as amorphous silicon, transparent conductive oxides (TCO), such as indium-tin-oxide (ITO) and indium-zinc-oxide (IZO), carbon nanotube film, or a transparent conducting polymer such as poly(3,4-ethylenedioxythiophene) (PEDOT), polyaniline, polyacetylene, polypyrrole, and polythiophene. In an embodiment, the contact lines 120 and contact pads 121,122 have a thickness of 1 μm or less. The conductive layer may be deposited using a suitable technique such as, but not limited to, physical vapor deposition (PVD). After deposition of the conductive layer, a patterning process, such as photolithography, may be used to define the conductive lines 120, and the conductive pads 121, 122.

Contact lines 120 may provide electrical connections for the LEDs that are subsequently bonded to the substrate 101. As shown in FIG. 5A, a single contact line 120 is formed in each bank structure 102, though embodiments are not limited to such configurations. For example, in embodiments in which two or more LEDs are integrated into each bank structure 102, one or more contact lines 120 may be formed in each bank structure to provide electrical connections to each LED 145 formed therein. According to an embodiment, contact pads 121 may provide electrical connections for a controller chip 147 (described in greater detail below) that is subsequently bonded to substrate 101, and contact pad 122 is a ground contact. Additional embodiments include contact lines 120 that electrically couple the LEDs 145 bonded to the substrate to a controller chip 147 bonded to contact pads 121 during subsequent processing.

In an embodiment, contact lines 120 may also include a reflective material in order to reflect light emissions from the LED 145. Embodiments may include different materials in different bank structures 102. By way of example, and not by way of limitation, aluminum or silver contact line 120 may be formed in bank structures 102 that will include LEDs 145 that emit green or blue light, and a gold, aluminum, or silver contact line 120 may be formed in one or more additional bank structures 102 that will include LEDs 145 that emit red light. Selecting metals based on the wavelength of light emitted from the LEDs 145 may improve the light extraction efficiency of the conformable electronic device. In FIG. 5A, contact lines 120 cover the entire surface of the bank structures 102. However, additional embodiments include contact lines 120 that do not cover the entire surface of the bank structures 102. By way of example, and not by way of limitation, the contact lines 120 may cover the entire surface of the bank structures (i.e., the sidewalls $144_A$ and $144_B$, and the bottom surface 105), or the contact lines 120 may cover only a portion of the bank structure surfaces.

It is to be appreciated that the cross-sectional illustration provided in FIG. 5A is zoomed in to show particular details of the bank structures 102 and the conductive layer including contact lines 120. Referring briefly to FIG. 9C, a perspective view is illustrated of the arrangement of arrays of LEDs 145, contact lines 120, and controller chips 147, according to an embodiment. An array of LEDs 145 and an array of controller chips 147 are formed on a front surface of the semiconductor substrate 101. As shown, each subpixel 181 includes a redundant pair of LEDs 145, though embodiments are not limited to such configurations and may have more or fewer LEDs 145 integrated into each subpixel 181. Embodiments having two or more LEDs 145 in each subpixel 181 provide redundancy in a situation where one of the LEDs 145 is defective or missing. Contact lines 120 may be arranged horizontally and vertically, as shown in FIG. 9C, although embodiments are not limited to such arrangements. Contact lines 120 provide electrical paths that couple each LED 145 to a controller chip 147. Top electrodes of LEDs 145 may be contacted with a top conductive layer 155 (explained in detail below). As shown in FIG. 9C, top conductive layer 155 is a transparent material. By way of example, top conductive layer 155 may be an indium tin oxide (ITO). In the embodiment illustrated in FIG. 9C, each controller chip 147 is electrically coupled to a plurality of LEDs 145, a plurality of sub-pixels, or a plurality of pixels. Specifically, each controller chip is illustrated as being electrically coupled to twelve RGB pixels 180, though this is only one example.

Figure 5B:
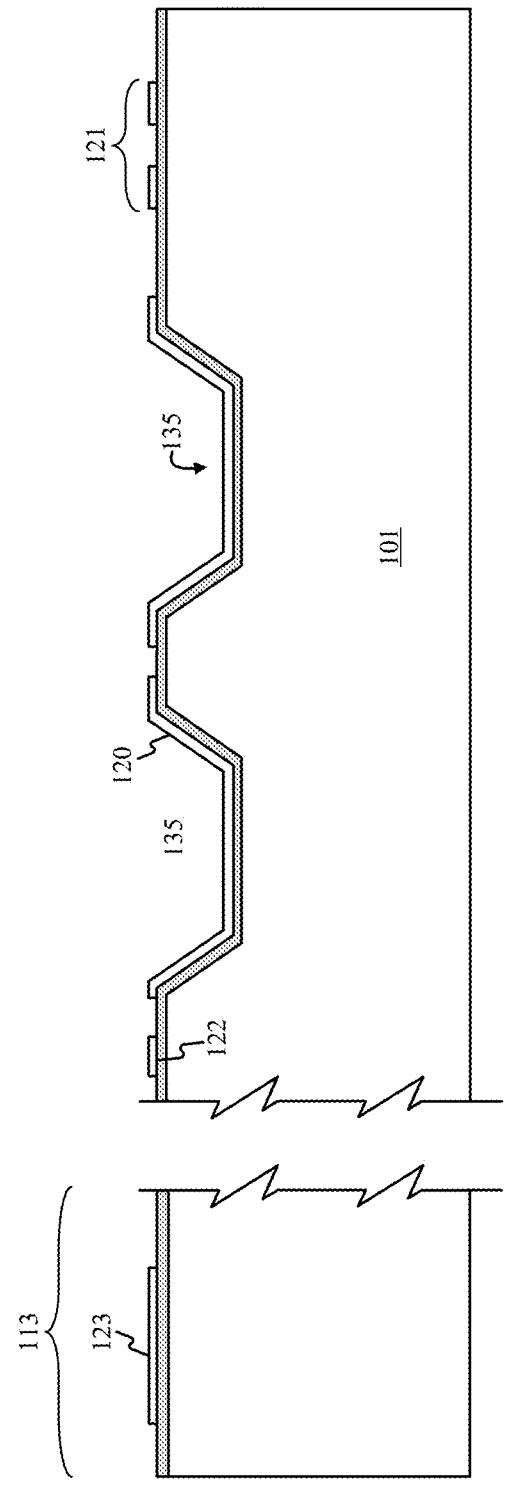

According to an embodiment, one or more additional contact pads 123 may be formed on an optional driver ledge 113 of the conformable electronic device, as shown in FIG. 5B. The driver ledge 113 may be formed around a peripheral region of the silicon substrate 101. In an embodiment, the driver ledge 113 may be formed around one or more, or all sides of the substrate 101. The contact pads 123 on the driver ledge 113 may provide electrical connections for additional display components 104 for operating the conformable electronic device 100. Alternatively, contact pads 123 may provide a contact for a flexible printed circuit used to provide an attachment to a printed circuit board (PCB) on which additional display components 104 are attached. For example, display components 104 can include driver ICs, such as data drivers and scan drivers, power management integrated circuit (IC), processor, timing controller, touch sense IC, wireless controller, communications IC, etc. The use of a driver ledge 113 and corresponding contact pads 123 may be useful for packaging the conformable electronic device, especially when vias $170_A$ and $170_B$ are not present to provide electrical connections through the substrate 101, as shown in FIG. 5B. In embodiments, both vias $170_A$ and $170_B$ and driver ledges 113 may be used to provide electrical connections for packaging.

Figure 6:
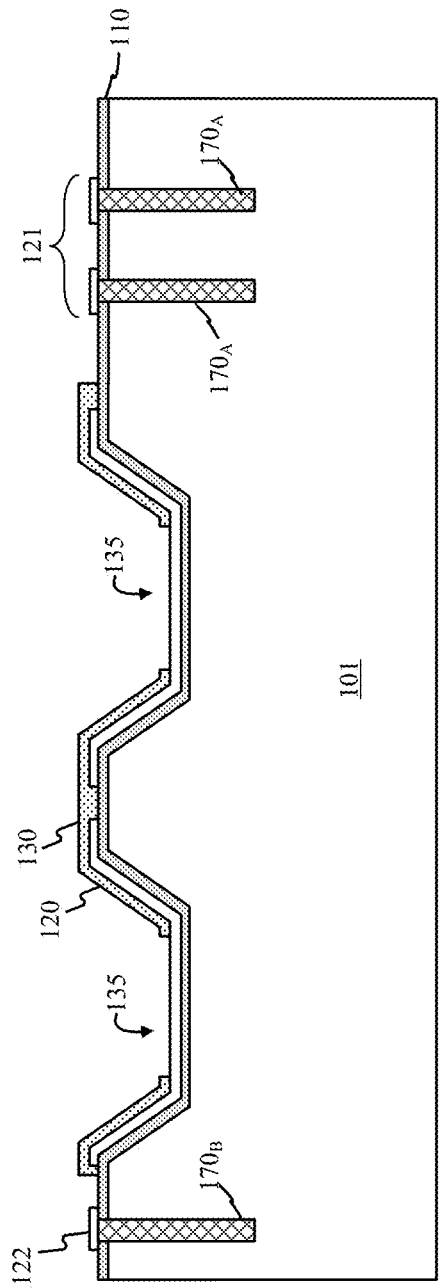

Referring now to FIG. 6, an insulating layer 130 may optionally be formed over the top surface of the contact lines 120. According to an embodiment, insulating layer 130 may be formed of a number of transparent, or translucent insulating materials in order to maximize the light extraction efficiency of the conformable electronic device 100. By way of example, the insulating layer 130 may comprise an oxide, such as $SiO_2$, or a nitride, such as $SiN_x$. In an embodiment, the insulating layer 130 is opaque. For example, the insulating layer may be a black matrix material. The insulating layer 130 may be deposited using a suitable technique such as, but not limited to, plasma enhanced chemical vapor deposition (PECVD). According to an embodiment, an array of contact openings 135 may be formed through the insulating layer 130 along the bottom surface 105 of each bank structure 102. Contact openings 135 provide an opening through which an electrical contact between an LED 145 and the contact lines 120 may be formed in a subsequent processing operation. According to an embodiment, the contact openings may be formed with a lithography and etching process, such as a dry etching process known in the art.

Figure 7:
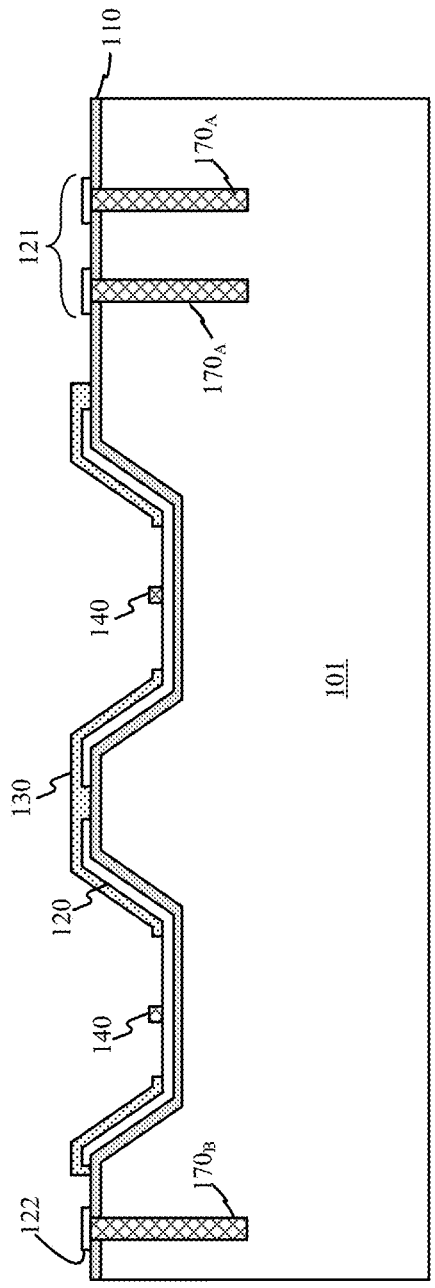

Referring now to FIG. 7, an array of bonding pads 140 are formed through each of the contact opening 135. The bonding pads 140 may be formed with suitable techniques such as a lift-off process. In such processes, the material forming the bonding pads 140 may be deposited with a sputtering or evaporation deposition process. According to an embodiment, the bonding pad 140 may be formed of a number of electrically conductive materials, such as indium, gold, silver, molybdenum, tin, aluminum, silicon, or an alloy thereof, or transparent conducting polymer. In an embodiment, the bonding pad 140 may be formed from a material that allows for low temperature bonding, such as a low temperature solder material. Exemplary low temperature solder materials may be indium, bismuth, or tin based solder, including pure metals and metal alloys. According to an embodiment the bonding pad 140 is approximately 0.1 µm to 1 µm thick.

Figure 8A:
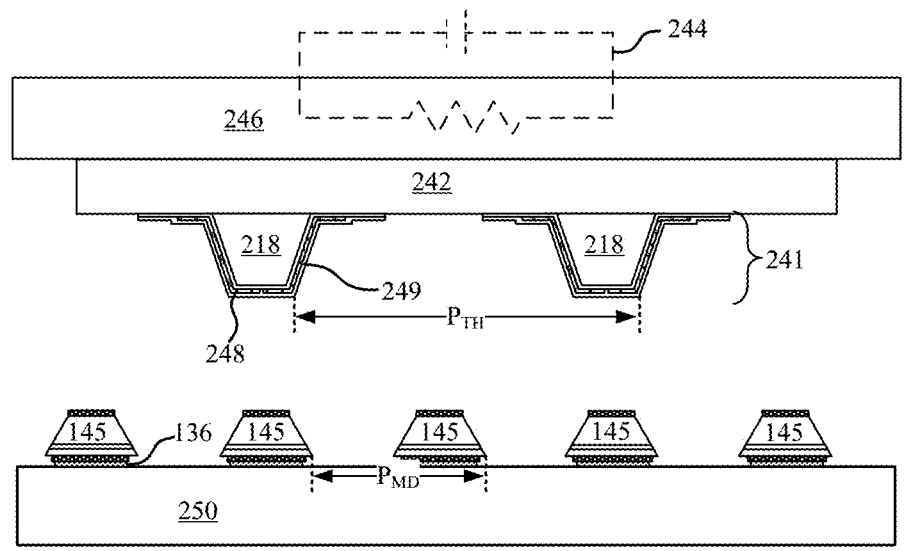
FIGS. 8A-8F are cross-sectional side view illustrations of a method of transferring and bonding an array of LEDs to a silicon substrate in accordance with an embodiment.
Figure 8B:
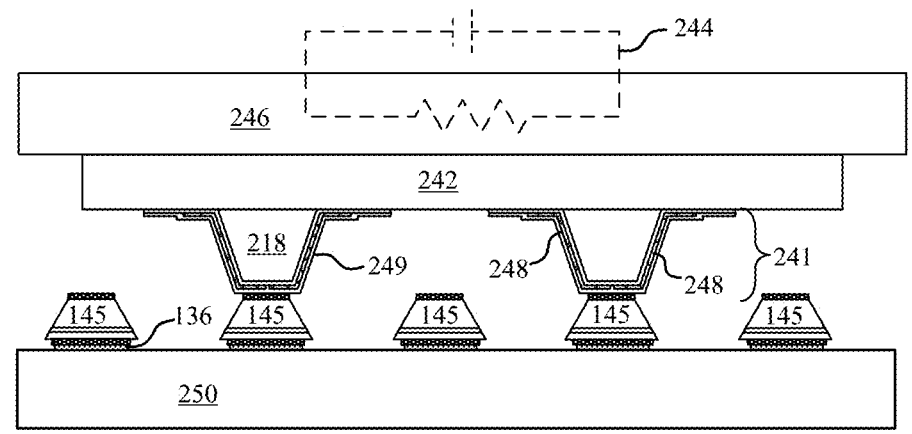
Figure 8C:
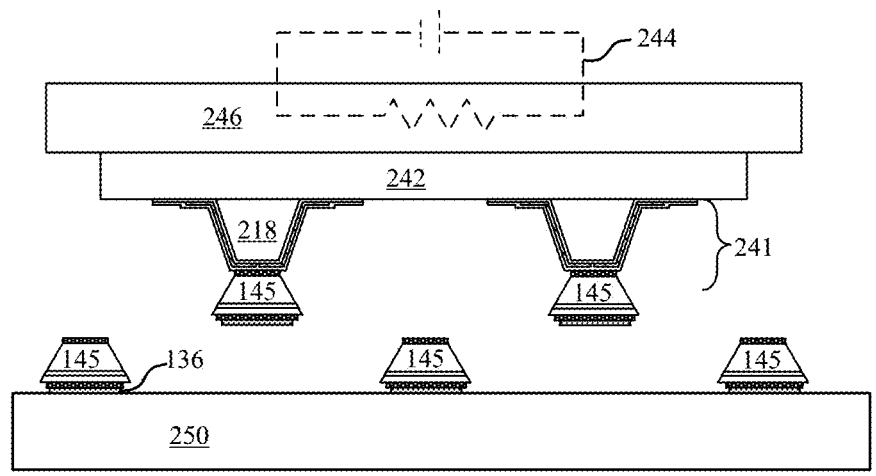

In an embodiment, an array of LEDs 145 is bonded to respective bonding pads 140 with a bonding process similar to the one described with respect to FIGS. 8A-8F. FIG. 8A is a cross-sectional side view illustration of an array of electrostatic transfer heads 241 supported by a substrate 242 and positioned over an array of LEDs 145 according to an embodiment. As illustrated, the pitch $P_{TH}$ of the array of electrostatic transfer heads 241 matches an integer multiple of the pitch $P_{MD}$ of the LEDs 145 formed on carrier substrate 250. The array of LEDs 145 are then contacted with the array of electrostatic transfer heads 241 as illustrated in FIG. 8B. In order to pick up the array of LEDs a voltage may be applied to the array of electrostatic transfer heads 241. In an embodiment, the voltage may be applied from the working circuitry within or connected to an electrostatic transfer head assembly 246 in electrical connection with the array of electrostatic transfer heads 241. Referring again to FIG. 8B, in the exemplary embodiments illustrated, the electrostatic transfer heads 241 are bipolar electrostatic transfer heads including a pair of electrodes 248 covered by a dielectric layer 249. However, embodiments are not limited to a bipolar electrode configuration and other configurations, such as monopolar electrodes, may be used. As illustrated, each electrostatic transfer head 241 includes a mesa structure 218 protruding from the substrate 242. In this manner each electrostatic transfer head 241 is configured to pick up an individual LED 145. The array of LEDs 145 is then picked up with the electrostatic transfer head assembly 246 as illustrated in FIG. 8C. As illustrated, LED bonding layers 136 formed on bottom surfaces of the LEDs 145 are also picked up with the array of LEDs 145.

Bonding layer 136 may be formed of a variety of materials useful for bonding the LEDs 145 to the bonding pads 140 upon transfer of energy from a transfer head assembly used to pick up the LEDs from a carrier substrate and bond the LEDs 145 to the substrate 101. The thickness of the bonding layer 136 may depend upon the bonding techniques, bonding mechanisms, and materials selections. In an embodiment, the bonding layer 136 is between 100 angstroms and 2 μm thick. In one embodiment the bonding layer 136 is gold.

In the embodiments illustrated in FIGS. 8A-8F, energy may be transferred to the bonding layers through an optional heater 244, illustrated with dotted lines. In the embodiments illustrated in FIGS. 8A-8F, heat may be transferred through the electrostatic transfer head assembly 246, through the array of electrostatic transfer heads 241 and the array of LEDs 145, and to bonding layers 136 with the optional heater 244. Heat can be applied in a variety of fashions including infra-red heat lamps, lasers, and resistive heating elements, amongst others.

Figure 8D:
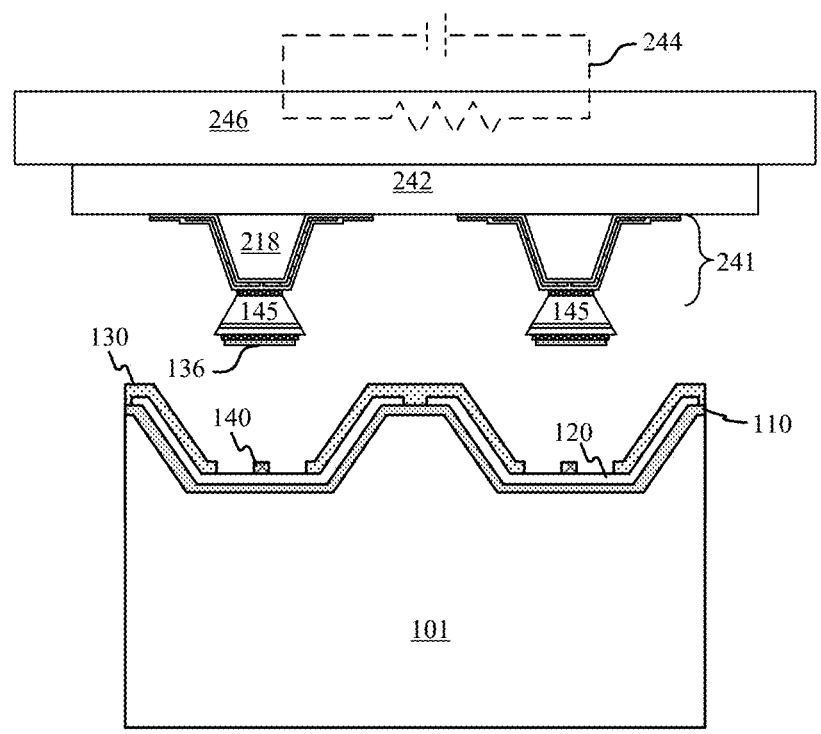
Figure 8E:
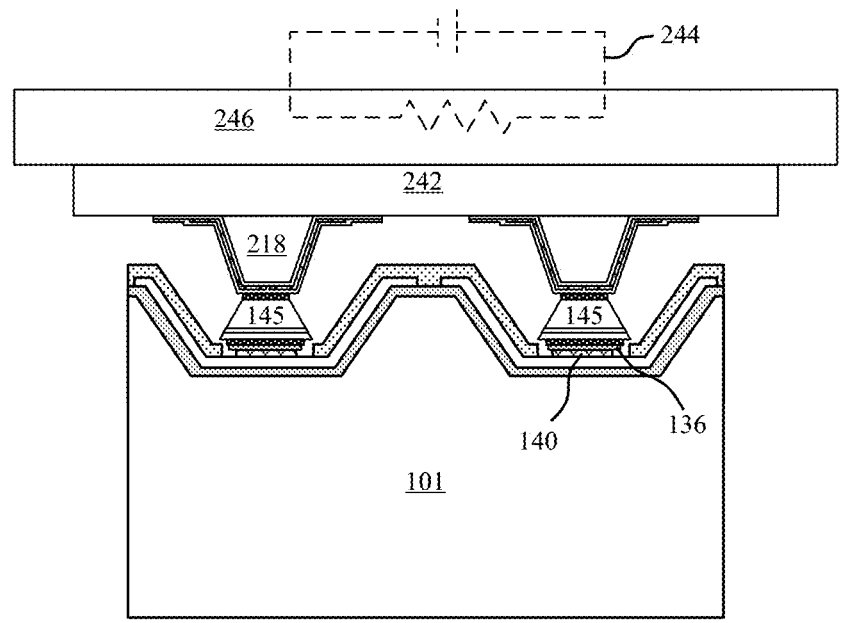
Figure 8F:
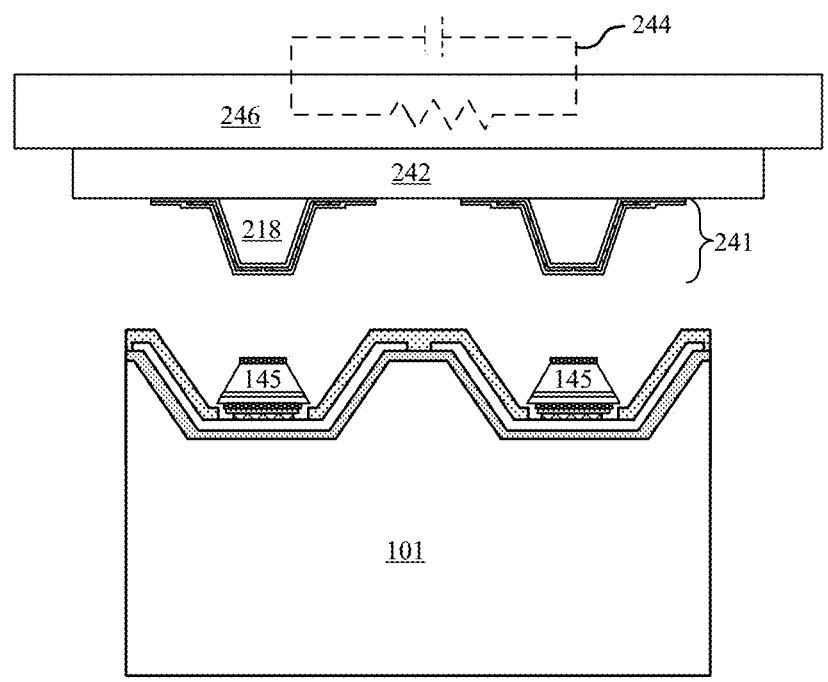

Referring now to FIG. 8D, the LEDs 145 are positioned over the silicon substrate 101. As illustrated, the array of LEDs 145 may be positioned over bonding pads 140 formed on silicon substrate 101. Referring now to FIG. 8E, the silicon substrate 101 is contacted with the array of LEDs 145. In an embodiment contacting the silicon substrate 101 with the array of LEDs includes contacting a bonding pad 140 with a bonding layer 136 for each respective LED. In an embodiment, the bonding pad 140 is liquefied during the bonding operation and spreads outwards under the LED 145. In an embodiment, transferring energy from the electrostatic transfer head assembly and through the array of LEDs may facilitate several types of bonding mechanisms such as eutectic alloy bonding, transient liquid phase bonding, and solid state diffusion bonding. In an embodiment thermal energy transferred from the electrostatic transfer head assembly is also accompanied by the application of pressure from the electrostatic transfer head assembly 246. Referring now to FIG. 8F, the grip pressure is released and the transfer head assembly 246 is raised above the substrate 101.

Figure 9A:
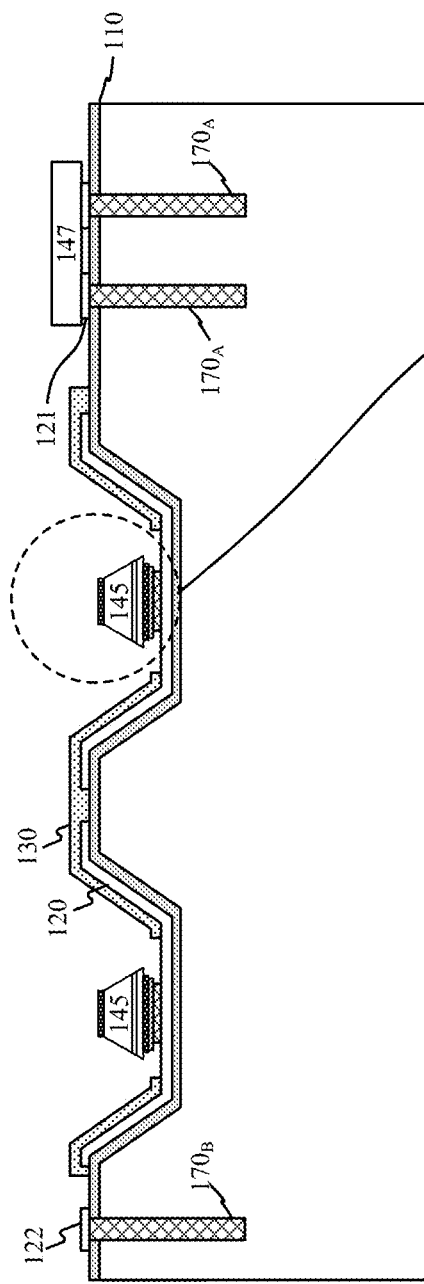
FIG. 9A is a cross-sectional side view illustration of a conformable electronic device in accordance with embodiments.
Figure 9A:
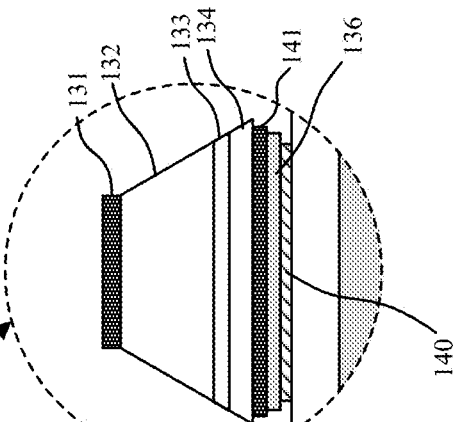

Referring now to FIG. 9A, the LEDs 145 and controller chips 147 have been bonded to the substrate 101. In an embodiment, an array of controller chips 147 is bonded to the substrate 101 with an electrostatic transfer head assembly in accordance with a process substantially similar to the one described above in FIGS. 8A-8E with respect to the bonding of the array of LEDs 145. In some embodiments, the height of the LEDs 145 mounted within the bank structures 102 is greater than the depth of the bank structures 102. In an embodiment, the depth of the bank structures 102 is between 0.5 μm and 10 μm depending on the PPI of the display. Having the top surface of the array of the LEDs 145 higher than the top surface of the silicon substrate 101 and any intervening layers may prevent any idle transfer heads used to bond the LEDs 145 from being damaged by or damaging the silicon substrate 101 (or any intervening layer) on the substrate 101 during placement of the LEDs 145 within the bank structures 102. For example, where the depth of the bank structures 102 is 0.5 μm, each LED 145 is 0.5 μm thick or thicker. For example, where the depth of bank structures 102 is 10 μm thick, each LED 145 is 10 μm thick or thicker. Alternatively, where each transfer head 241 corresponds to a bank structure 102, it is possible for the top surfaces of the LEDs 145 to be below the top surface of the silicon substrate 101. For example, where the depth of bank structures 102 is 10 μm thick, each LED has a thickness less than 10 μm.

According to an embodiment, the LEDs 145 are vertical LEDs and include a micro p-n diode, a top electrode 131, and a bottom electrode 141, with the bottom electrode 141 bonded to a bonding layer 136. In an embodiment, the micro p-n diode is an inorganic based diode and includes a top n-doped layer 132, one or more quantum well layers 133, and a lower p-doped layer 134. In other embodiments, the doping of layers 132, 134 may be reversed. The conductive electrode layers 131, 141 may include one or more layers. For example, the electrodes 131, 141 may include an ohmic contact layer that makes ohmic contact with the micro p-n diode. In an embodiment, bottom electrode 141 includes an ohmic contact layer and a barrier layer between the ohmic contact layer and the LED bonding layer 136. The barrier layer may protect against diffusion or alloying between the bonding layer and other layers in the electrode layer, for example during bonding to the receiving substrate. In an embodiment, the barrier layer may include a material such as Pd, Pt, Ni, Ta, Ti and TiW. The electrodes 131, 141 may be transparent to the visible wavelength range (e.g. 380 nm-750 nm) or opaque. The electrodes 131, 141 may optionally include a reflective layer such as Ag or Ni. In an embodiment, the bottom surface of the micro p-n diode is wider than the top surface of the bottom electrode 141. In an embodiment, the bottom surface of the bottom electrode 141 is wider than a top surface of the LED bonding layer 136. A conformal dielectric barrier layer (not illustrated) may optionally be formed over the micro p-n diode and other exposed surfaces. In an embodiment, LEDs 145 bonded to the substrate 101 may emit various wavelengths of light, such as, but not limited to red (e.g., 610 nm-760 nm), green (e.g., 500 nm-570 nm), or blue (e.g., 450 nm-500 nm). Accordingly, each of the LEDs 145 may serve as a sub pixel in a RGB pixel. It is noted that embodiments are not limited to RGB displays, and additional embodiments include pixels that comprise color combinations that include fewer than three colors or more than three colors, or color combinations other than RGB.

Figure 9B:
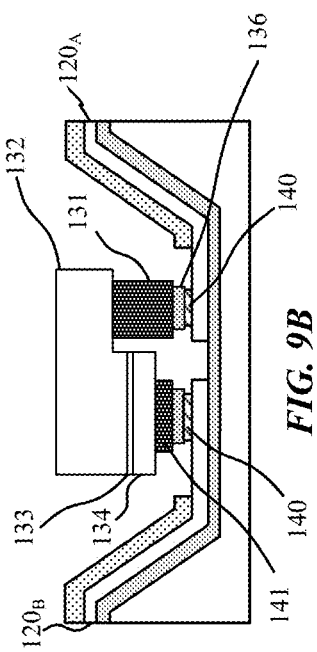
FIG. 9B is a cross-sectional side view illustration of horizontal LED bonded to a silicon substrate in accordance with embodiments.
Figure 9C:
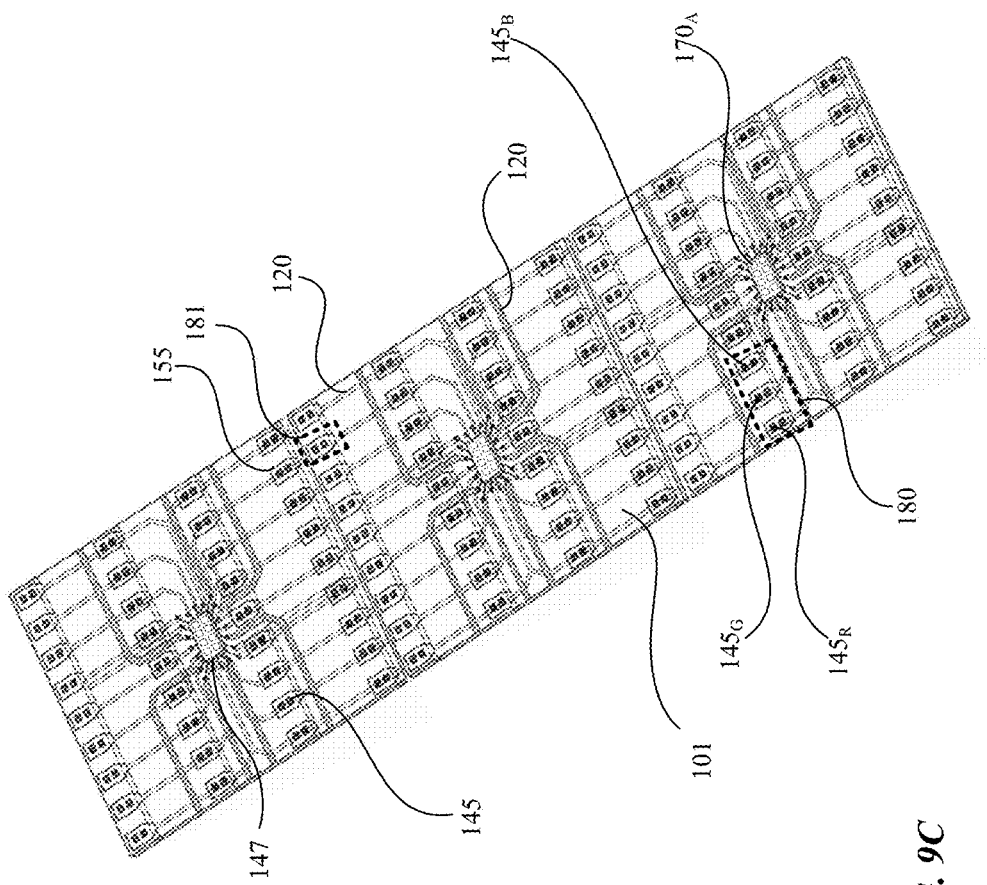
FIG. 9C is a perspective view illustration of a conformable electronic device illustrating an arrangement of LEDs and controller chips in accordance with embodiments.

In an embodiment, the LEDs 145 may be horizontal LEDs as shown in FIG. 9B. Horizontal LED devices include electrodes 131, 141 to the doped layers 134 and 132 that are both formed on bottom surfaces of an LED device in order to make electrical contact with bonding pads 140 formed on the bottom surface 105 of each bank structure 102, as shown in FIG. 9B. In such embodiments, a first contact line $120_A$ is electrically coupled to contact 131, and a second contact line $120_B$ is electrically coupled to contact 141.

An array of controller chips 147 is bonded to one or more of the contact pads 121. According to an embodiment, the array of controller chips 147 is transferred from a carrier substrate to the silicon substrate 101 and bonded with an electrostatic transfer head picking and placing process substantially similar to the process described above with respect to the array of LEDs 145. Depending on the size of the controller chips 147, other transfer and bonding processes may be used, such as flip chip bonding. According to an embodiment, each controller chip 147 bonded to the substrate 101 controls one or more pixels of an electronic display. In an embodiment, each controller chip 147 controls one or more sub-pixels of an electronic display. In an embodiment illustrated in FIG. 9C, each controller chip 147 controls twelve RGB pixels, though a variety of other configurations are possible.

In an embodiment, controller chips 147 replace the thin-film transistor (TFT) layer of a conventional active matrix display, and include circuitry to switch and drive one or more LEDs 145. For example, each controller chip 147 includes one or more two-transistor one capacitor (2T1C) circuits, six-transistor 2-capacitor (6T2C) circuits, or modifications and variations thereof in order to provide switching and driving capabilities. Controller chips 147 also contain circuitry for receiving signals from display components 104 that are electrically coupled to the contact pads 121. While controller chip 147 illustrated in FIG. 9A is shown as being bonded to two contact pads 121, additional embodiments include controller chips 147 that are bonded to one or more contact pads 121. A plurality of contact pads 121 may be used to provide a desired number of input and output terminals for each controller chip 147. By way of example, and not by way of limitation, input terminals and output terminals to each controller chip 147 include scan lines, data lines, power supplies, sensing circuit terminals, and/or ground lines. In an embodiment, there may be multiple sets of input and output terminals for each controller chip 147, with each set of input and output terminals being used for controlling one of a plurality of LEDs 145 coupled to the controller chip 147. In an embodiment, there may be multiple sets of input and output terminals for each controller chip 147, with each set of input and output terminals being used for controlling one of a plurality of pixels coupled to the controller chip 147.

Referring now to FIG. 9C, an exemplary perspective view of the arrangement of LEDs 145, contact lines 120, and controller chips 147 according to an embodiment is shown. As shown, each controller chip 147 is electrically coupled to a plurality of LEDs 145 by contact lines 120, though embodiments are not so limited. Contact lines 120 may be arranged horizontally and vertically, as shown in FIG. 9C, although embodiments are not limited to such arrangements. The bank structures 102 and LEDs 145 may be arranged in a pattern to form one or more pixels 180. For example, pixel 180 shown in FIG. 9C includes three subpixels 181 with LEDs $145_R$, $145_G$, or $145_B$ integrated into each subpixel 181. By way of example, and not by way of limitation, the LEDs 145 may be LEDs and form an RGB pixel, with $145_R$ being a red LED, $145_G$ being a green LED, and $145_B$ being a blue LED. As shown, each subpixel 181 includes two LEDs 145. Embodiments having two or more LEDs 145 in each subpixel 181 provide redundancy in a situation where one of the LEDs 145 is defective or missing. In an embodiment, vias $170_A$ extend through the silicon substrate 101 to provide an electrical connection to the backside of the silicon substrate. Vias $170_A$ are covered by controller chips 147 and are therefore illustrated with dotted lines. Top electrodes of LEDs 145 may be contacted with a top conductive layer 155 (explained in detail below). As shown in FIG. 9C, top conductive layer 155 is a transparent material. By way of example, top conductive layer 155 may be ITO.

Figure 10:
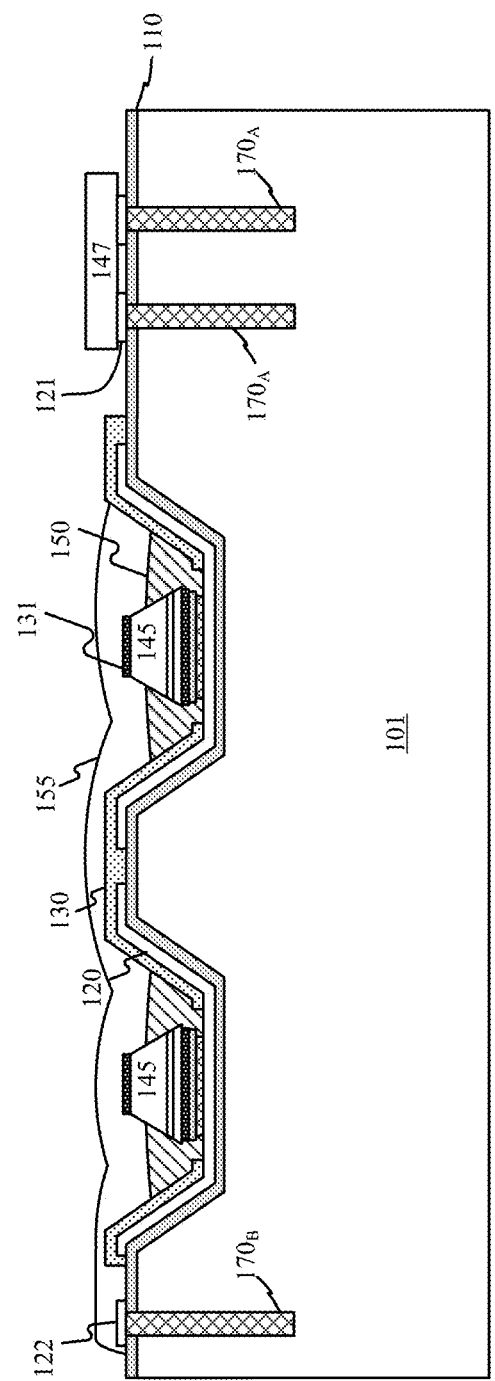
FIGS. 10-11C are cross-sectional side view illustrations of conformable electronic devices in accordance with embodiments during various processing operations.

Referring now to FIG. 10, a sidewall passivation 150 is formed along the sidewalls of the LEDs 145. For example, sidewall passivation 150 may pool around the LEDs 145 within the bank structures. In accordance with embodiments, the sidewall passivation 150 is transparent or semi-transparent to the visible wavelength so as to not significantly degrade light extraction efficiency of the conformable electronic device. In an embodiment sidewall passivation 150 is opaque. For example, sidewall passivation 150 may be a black matrix material. Sidewall passivation may be formed of a variety of materials such as, but not limited to epoxy, poly(methyl methacrylate) (PMMA), benzocyclobutene (BCB), polyimide, and polyester. In an embodiment, an ink jet process is used to form the sidewall passivation 150 around the LEDs 145. Sidewall passivation 150 may insulate exposed sidewalls of the LEDs 145 in order to prevent the devices from being short circuited. According to an embodiment, the top surface of the sidewall passivation 150 is formed above the quantum well layer(s) of the LED 145 and below the top surface of the top electrode 131 of the LEDs 145.

As shown in FIG. 10 sidewall passivation 150 also reduces the step height of a top conductive layer 155. According to embodiments, an electrical contact is made from the contact pad 122 to the top electrodes 131 of the LEDs 145 with the top conductive contact layer 155. Top conductive contact layer 155 may be transparent, or semi-transparent to the visible wavelength. Exemplary transparent conductive materials include amorphous silicon, TCOs, such as ITO and IZO, carbon nanotube film, or a transparent conductive polymer such as PEDOT, polyaniline, polyacetylene, polypyrrole, and polythiophene. In an embodiment, the top conductive contact layer 155 includes nanoparticles such as silver, gold, aluminum, molybdenum, titanium, tungsten, ITO, and IZO. In a particular embodiment, the top conductive contact layer 155 is formed by ink jetting. Other methods of formation may include chemical vapor deposition (CVD), PVD, or spin coating.

Figure 11A:
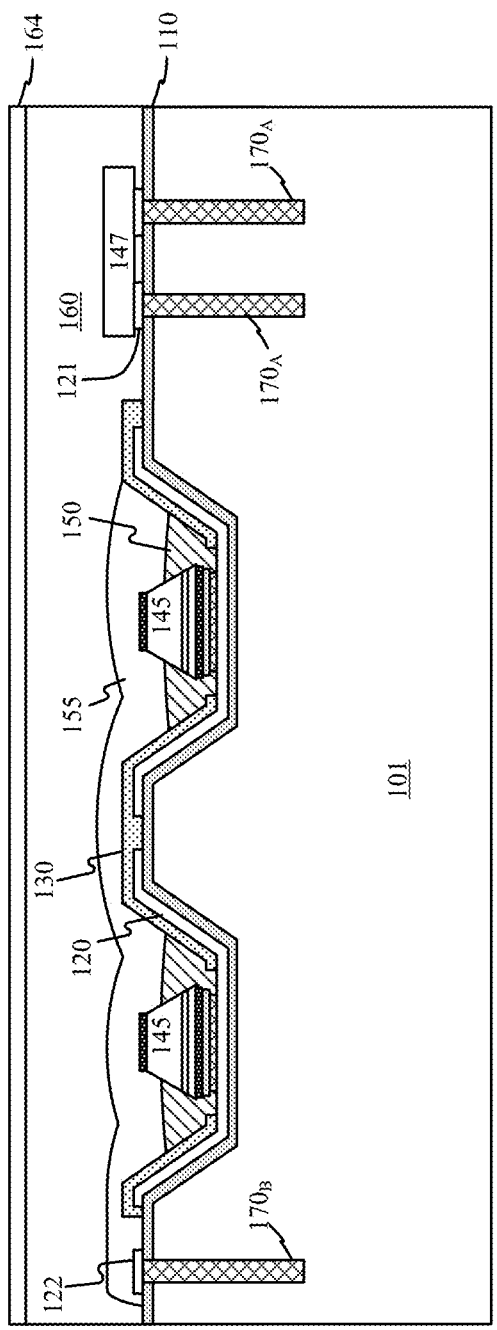

Referring now to FIG. 11A, a top passivation layer 160 is formed over the top surface of the semiconductor substrate 101, the top conductive layer 155 and the controller chips 147. According to embodiments, the top passivation layer 160 is transparent or semi-transparent so as to not degrade light extraction efficiency of the system. In order to render the device conformable, the top passivation layer 160 may be formed with a material that has a sufficiently low modulus and that is not brittle. Exemplary materials for the top passivation layer 160, include, but are not limited to, poly (dimethylsiloxane) (PDMS), PMMA, polyimide, and polyester, and may be formed by a variety of methods including CVD or spin coating. According to an embodiment, a scratch resistant layer 164 may also be formed on the top passivation layer 160. Since the scratch resistant layer is an outer layer of the conformable electronic device 100, it will experience a higher degree of strain when the display 100 flexes. Accordingly, materials chosen for a scratch resistant layer 164 may have a sufficiently high tensile strength in order to prevent deformation or failure.

Figure 11B:
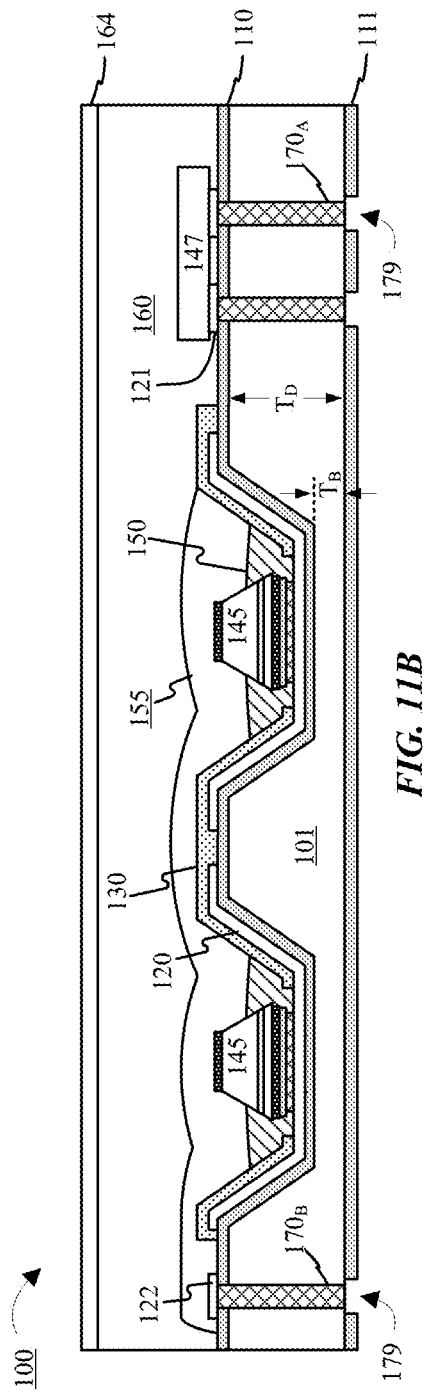
Figure 11C:
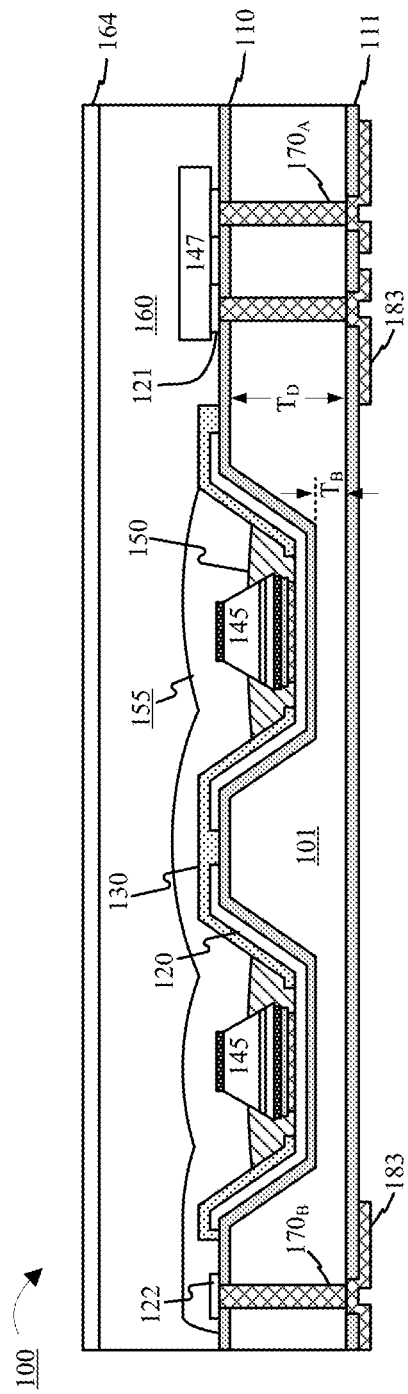

Referring now to FIG. 11B, the thickness of the silicon substrate 101 is reduced from the thickness $T_S$ to a final device thickness $T_D$. According to embodiments, the silicon substrate is reduced to a device thickness $T_D$ less than approximately 50 μm. As such, the substrate 101 is converted from a rigid state that it suitable for fabrication to a conformable state. According to an embodiment, the silicon substrate 101 is reduced to a device thickness $T_D$ less than 20 μm. In an embodiment, the silicon substrate 101 is reduced to a device thickness $T_D$ between 5 μm and 20 μm. Due to the presence of bank structures 102, the thickness of the substrate may be thinner in portions and have a minimum thickness $T_B$ below the bank structures. For example, thickness $T_B$ may be between 1 μm and 45 μm. Bank structures 102 are not required, however, and may not be present in other embodiments. In some embodiments that include vias $170_A$ and $170_B$, the reduction in thickness may also expose bottom surfaces of vias $170_A$ and $170_B$, thereby enabling electrical connections to be made from the top side of the substrate 101 to the back side of the substrate 101. According to an embodiment, the thickness of the silicon substrate is reduced with an etching process, a polishing process, or a combination of the two. In a particular embodiment, the silicon substrate 101 may first be polished to a thickness of approximately 100 µm, and thereafter etched to a thickness of less than 50 µm. In an embodiment, an oxide layer 111, such as a $SiO_2$ layer, is formed on the bottom surface of the substrate 101 after the thinning process. The oxide layer 111 may be deposited or grown. For example, the oxide layer 111 may be deposited with PECVD or grown with wet thermal oxidation. According to an embodiment, the bottom oxide layer 111 may be a transparent or semi-transparent material. An oxide layer 111 improves the adhesion of a build-up structure 201 or a redistribution layer 202 that may be formed on the bottom surface of the conformable electronic device 100, according to embodiments. Openings 179 may be patterned through the oxide layer 111 to expose the bottom surfaces of the vias $170_A$ and $170_B$. As shown in FIG. 11C, the conductive material is deposited into the openings 179 and along the bottom surface of the oxide layer 111. The conductive material may be patterned to form redistribution lines 183. In an embodiment, the conductive material used to form the redistribution lines is copper, and is deposited with an electroless process, evaporation, or sputtering.

Figure 12A:
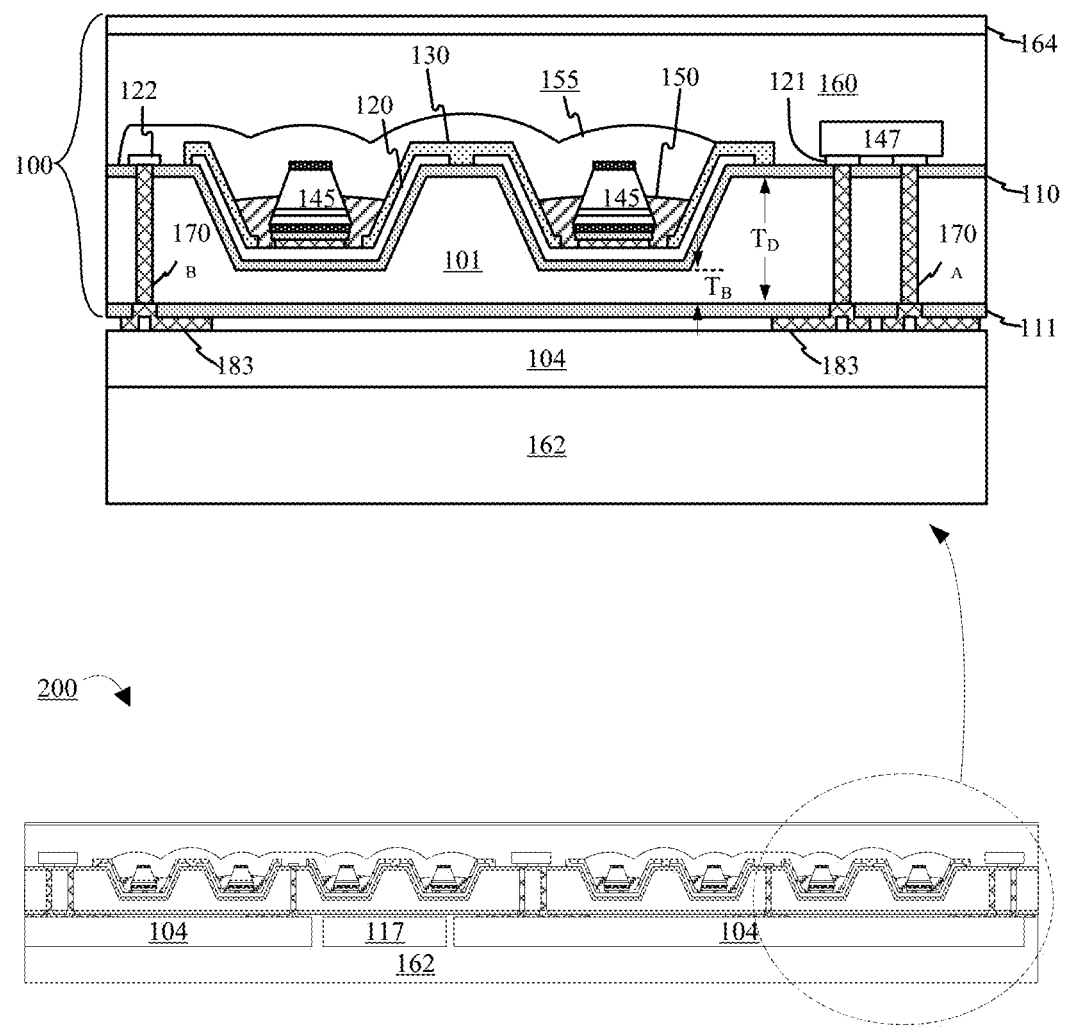
FIG. 12A is a cross-sectional side view illustration of a conformable electronic package in accordance with an embodiment.
Figure 12B:
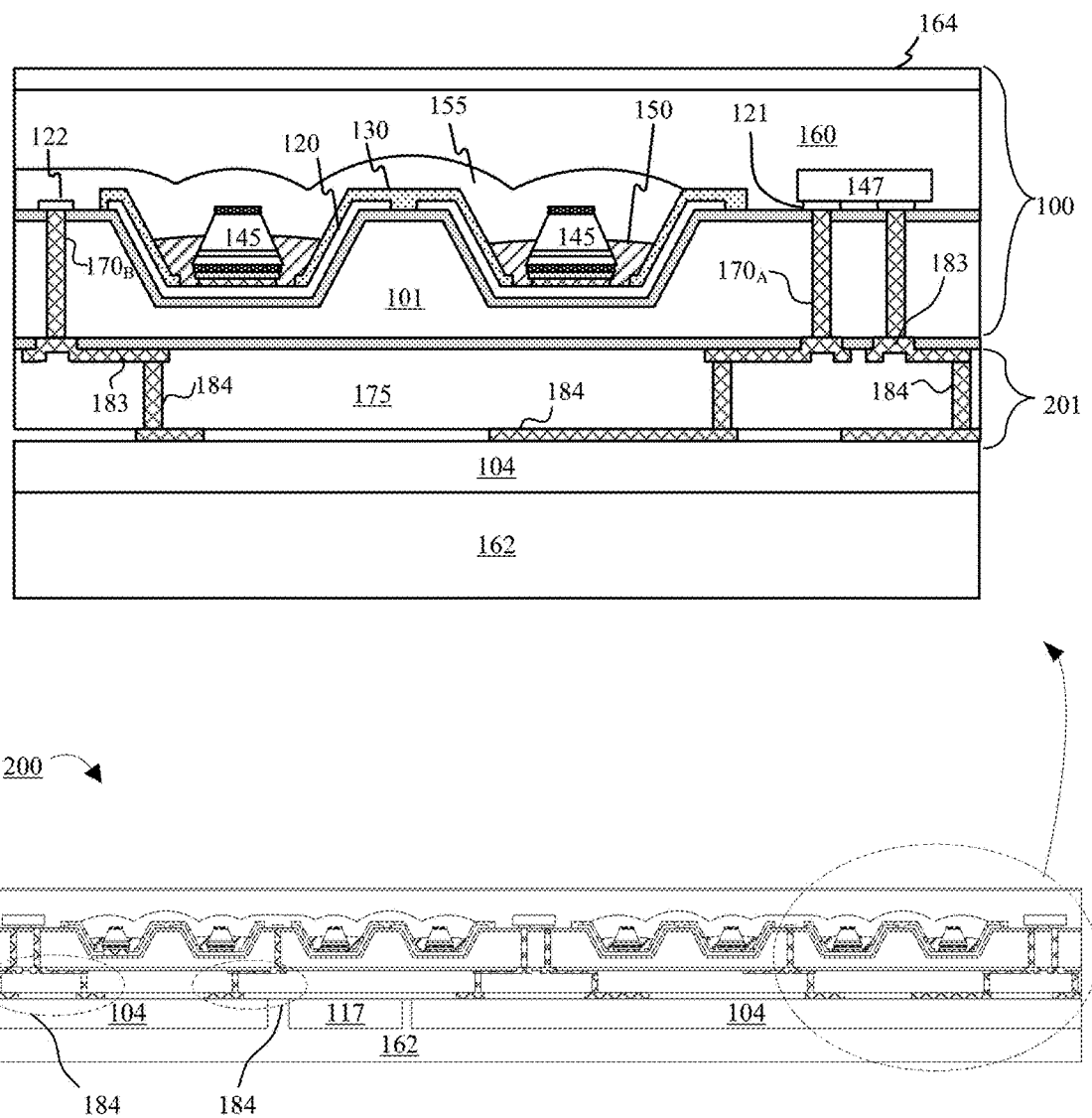
FIG. 12B is a cross-sectional side view illustration of a conformable electronic package in accordance with an embodiment.
Figure 12C:
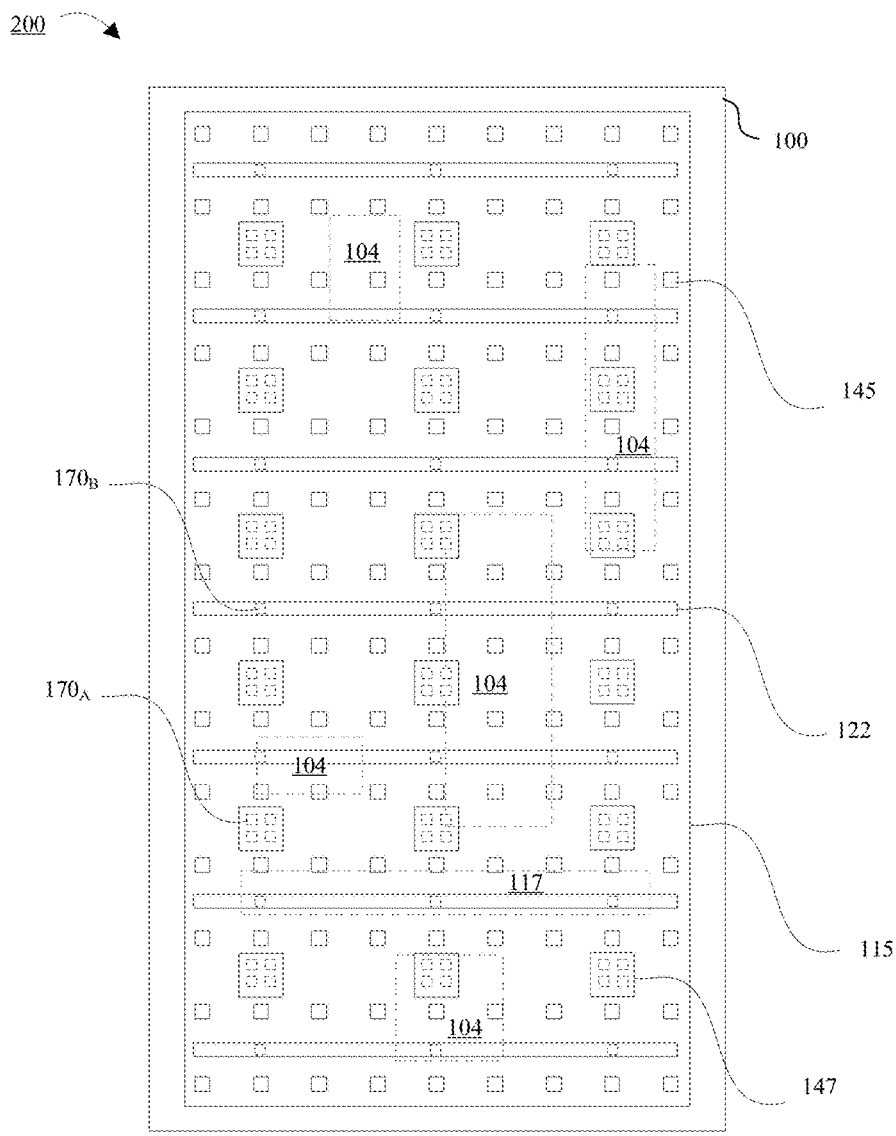
FIG. 12C is an overhead view illustration of the conformable electronic packages of FIGS. 12A-12B in accordance with an embodiment.

In embodiments that include vias $170_A$ and $170_B$ the conformable electronic device 100 may be integrated into a conformable electronic package 200 as shown in FIGS. 12A-12C. FIGS. 12A-12C are exemplary (and not to scale) cross-sectional side views and overhead views of a conformable electronic package 200 according to an additional embodiment.

In FIG. 12A, a conformable electronic device 100 has one or more display components 104 bonded to a bottom surface of the redistribution lines 183. In an embodiment, the flexible build-up structure includes the redistribution lines 183, and no additional layers of conductive materials or insulating materials are required. Accordingly, electrical connections from the back surface of the conformable electronic package 200 can be made to contacts 121 and 122 on the top surface of the silicon substrate 101. By way of example, and not by way of limitation, display components 104 can include a driver ICs, such as a scan driver and a data driver, power management IC, processor, memory, timing controller, touch sense IC, wireless controller, communications IC, etc.

According to an embodiment illustrated in FIG. 12B, a flexible build-up structure 201 is formed on a bottom surface of the conformable electronic device 100 in order to allow the contacts to fan out. In an embodiment, the flexible build-up structure 201 includes one or more insulating layers 175. In an embodiment, the one or more insulating layers 175 are polymer layers, such as photo-definable polymer layers. In a particular embodiment, the one or more polymer layers are formed with a photo-definable polyimide material. In an embodiment, the layers forming the build-up structure 201 may be spun on or laminated. By way of example, the build-up structure 201 may include one or more conductive layers, such as wiring 184 that provides an electrical path through the build-up structure 201. In an embodiment, one or more display components 104 are bonded to a bottom surface of the build-up structure 201 and are electrically coupled to the wiring 184. The wiring 184 is electrically coupled to vias $170_A$ and $170_B$, which extend between the front surface and back surface of the conformable electronic device 100.

Referring to both FIGS. 12A-12B, a bottom passivation layer 162 is formed over the bottom surface of the conformable electronic device 100 and may cover the display components 104. Materials such as, but not limited to, PDMS, PMMA, polyimide, and polyester may be used to form bottom passivation layer 162. A variety of methods including CVD or spin coating may be used to form the bottom passivation layer. The bottom passivation layer 162 may be chosen to be the same material as the top passivation layer 160.

In an embodiment, the silicon layer 101 is at or close to a neutral (strain) axis between opposite surfaces of the conformable electronic package 200. For example, where the conformable electronic package is rolled or bent, one surface is under tensile strain while the opposite surface is under compressive strain. Location of the neutral (strain) axis, may be determined by thickness and material properties of the layers within the conformable electronic package 200.

Referring now to FIG. 12C, the display components 104 may be located on the back surface of the display substrate directly behind the display area 115. In one embodiment, a battery 117 may also be formed on the back surface of the conformable display 100. In FIG. 12C, vias $170_A$ are shown as hidden lines below controller chips 147 and contacts 122 are shown as strips formed between rows of LEDs 145, though embodiments are not limited to this exemplary configuration. One or more vias $170_B$ are formed below each contact 122 to provide an electrical connection to the backside of the package. Contact lines 120 and top conductive contact layer 155 are omitted from FIG. 12C in order to not unnecessarily obscure the figure.

While conformable electronic package 200 shown in FIGS. 12A-12C is formed from a bulk silicon substrate 101 and with LEDs 145 integrated into bank structures 102, embodiments are not so limited. A substantially similar conformable electronic package 200 can be formed from an SOI substrate such as the one described with respect to FIGS. 1B and 4B. Alternatively, a conformable electronic package 200 may optionally be formed without an array of bank structures 102.

Figure 13A:
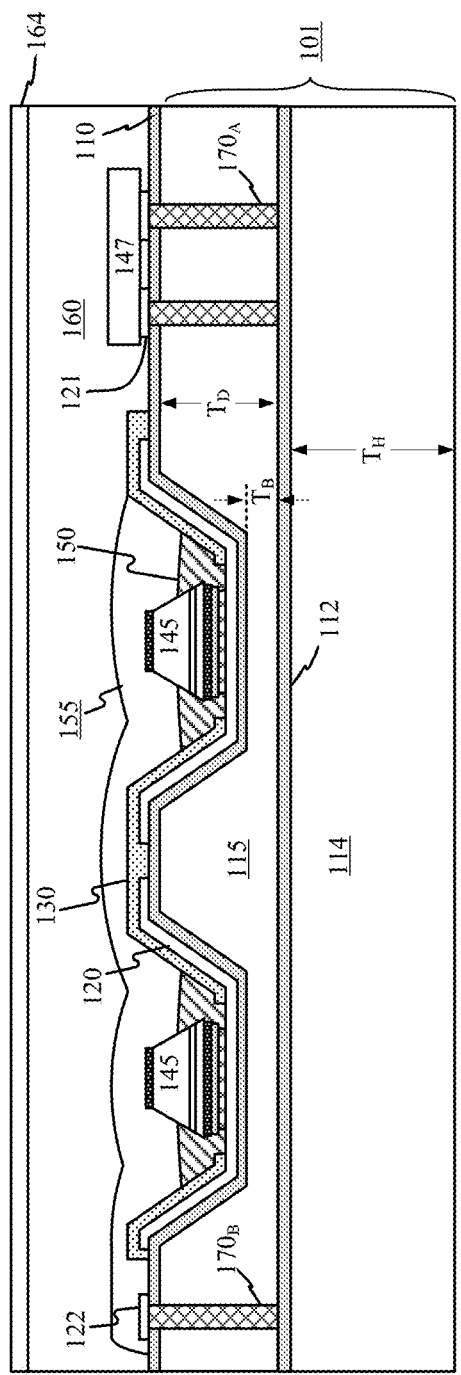
FIGS. 13A-15B are cross-sectional side view illustrations of conformable electronic devices in accordance with embodiments during various processing operations.
Figure 13B:
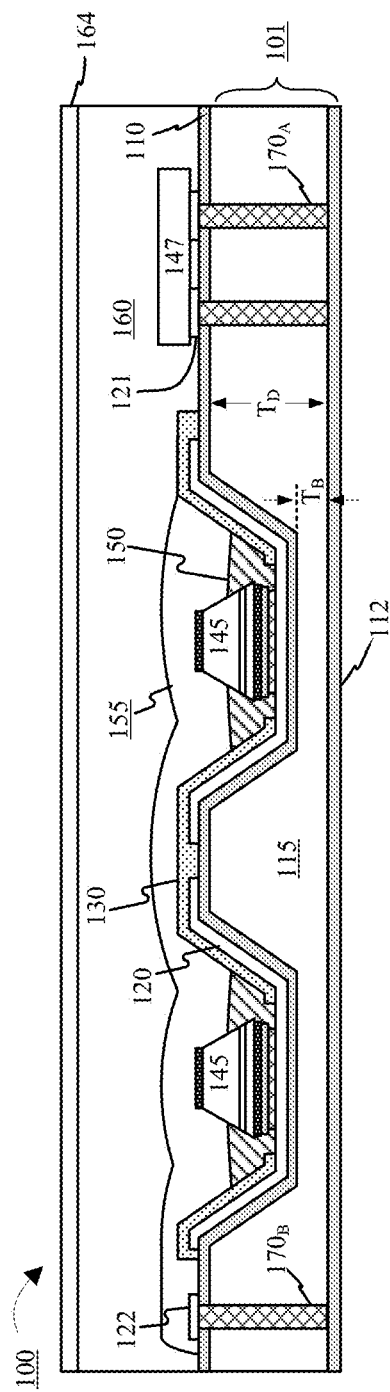
Figure 13C:
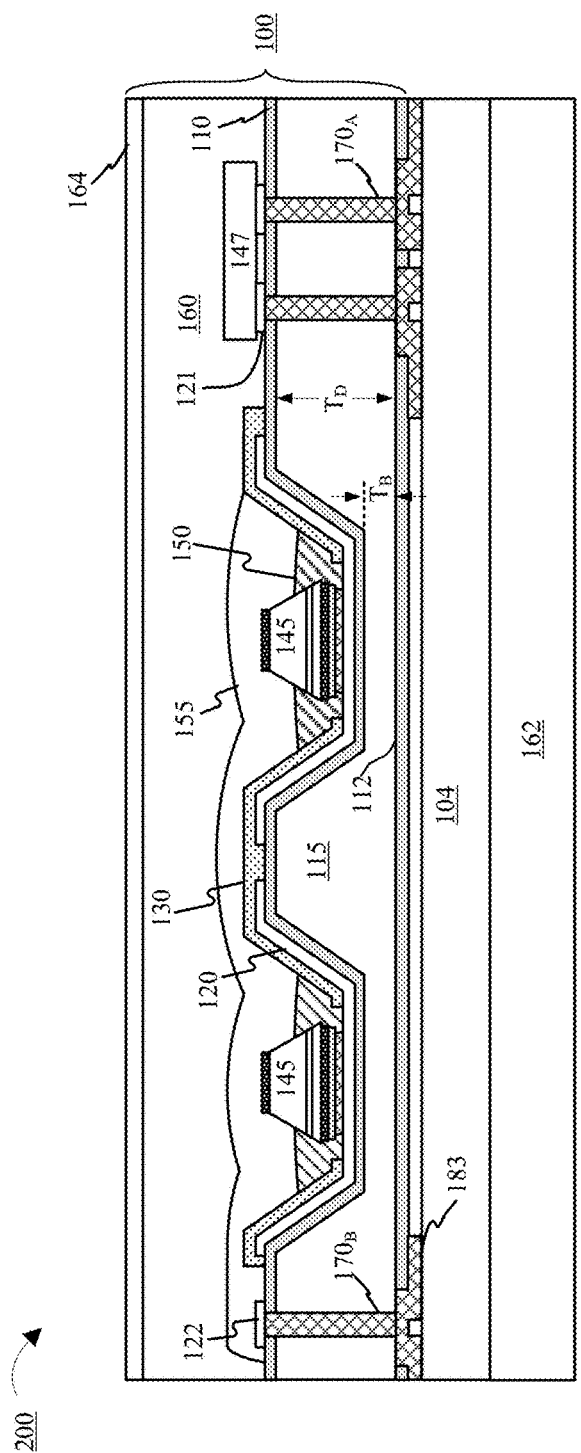

Referring now to FIGS. 13A-13C, a process for forming a conformable electronic package 200 from an SOI substrate 101 is shown. FIG. 13A is substantially similar to FIG. 11A, with the exception that substrate 101 is an SOI substrate including an upper silicon layer 115, a buried oxide layer 112, and a bulk silicon layer 114. As shown in FIG. 13B, the bulk silicon substrate 114 is removed. According to embodiments, the bulk silicon substrate 114 may be removed with an etching process, a polishing process, or a combination of the two. Furthermore, the buried oxide 112 may optionally serve as an etch stop material and therefore, a greater degree of precision is available during the thinning process because over etching will not cause the substrate 101 to be etched too thin. In an embodiment, the buried oxide 112 is removed with an etching process, a polishing process, or a combination of the two. After SOI substrate 101 has been thinned, a build-up structure may be formed over the bottom surface. For example, the build-up structure may be redistribution lines 183 formed over the bottom surface, as shown in FIG. 13C. The redistribution lines 183 are substantially similar to those described above in detail with respect to FIG. 12A. In an embodiment, the build-up structure includes multiple layers. For example, build-up structure may be formed substantially similar to the build-up structure 201 described in detail above with respect to FIG. 12B. In the embodiment illustrated in FIG. 13C, the buried oxide layer 112 is not removed during the thinning process.

Figure 14:
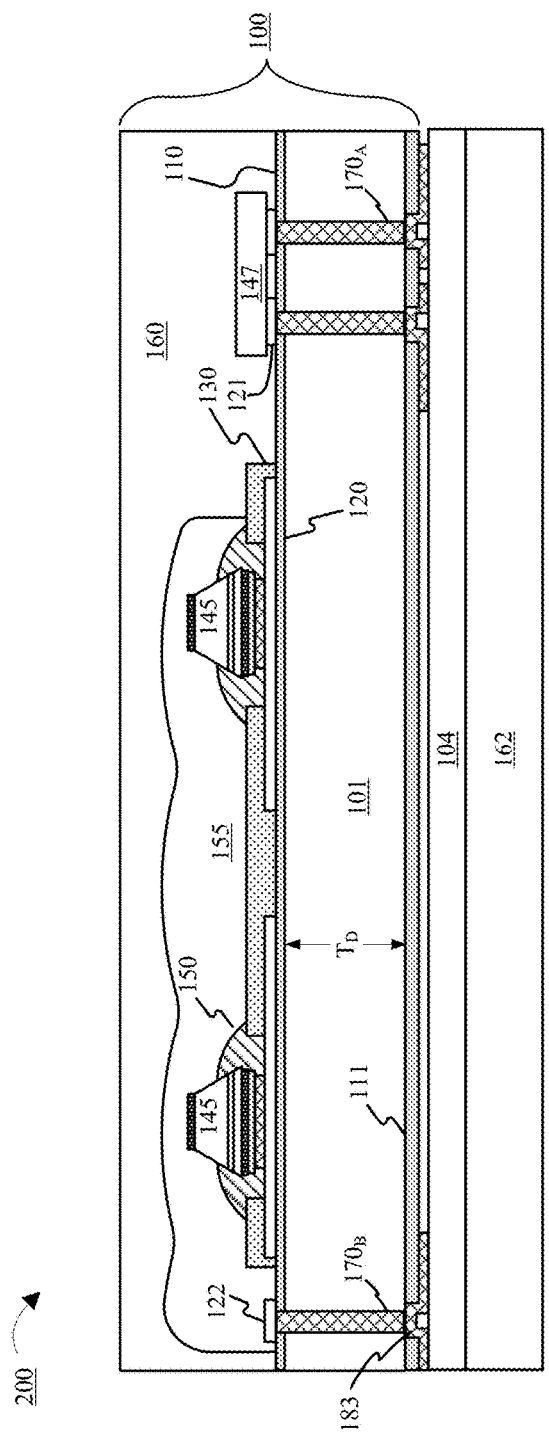

In an additional embodiment, a conformable electronic device 100 is formed with substantially the same process as described above, with the exception that the LEDs 145 are not integrated into bank structures 102. Such a conformable display 100 is shown in FIG. 14. According to an embodiment, a conformable electronic device without bank structures 102 may include vias $170_A$ and $170_B$ and be integrated with redistribution lines 183 or a build-up structure 201 to form a conformable electronic packages 200 substantially similar to the ones described in FIGS. 12A-13C.

Figure 15A:
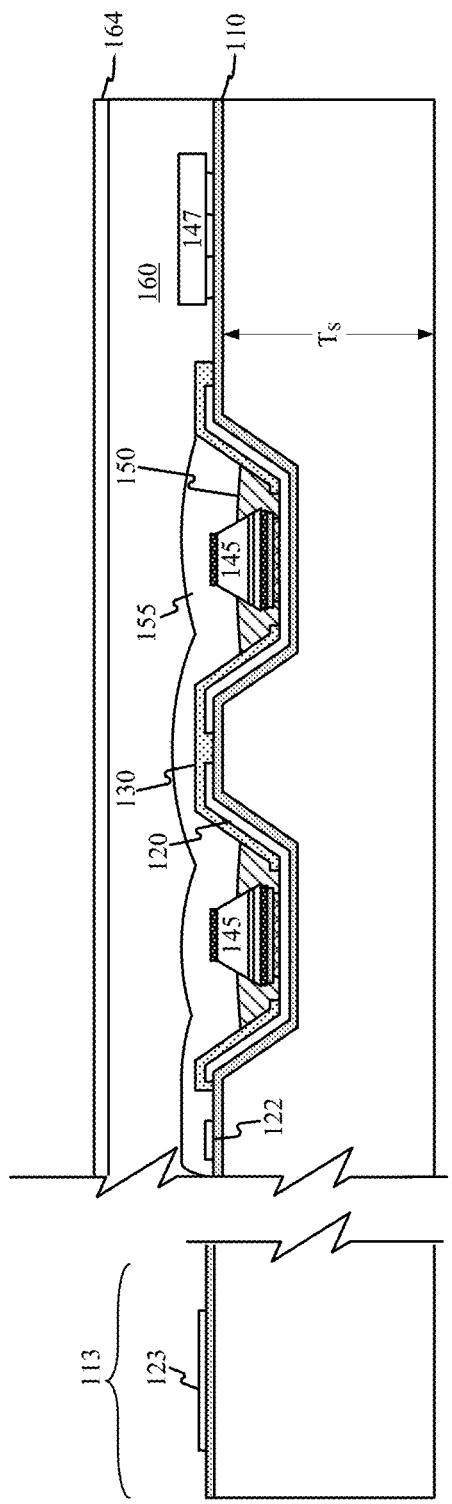
Figure 15B:
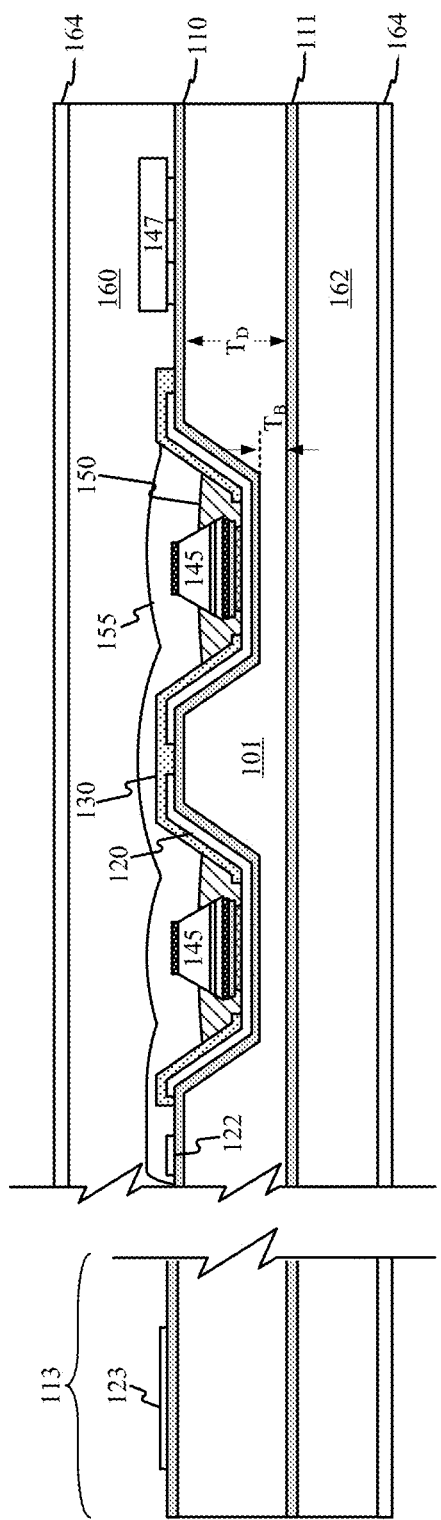

Referring now to FIG. 15A, a driver ledge 113 with contact pads 123 is formed on a peripheral region of the silicon substrate 101 out of the display area 115 in accordance with an embodiment. The driver ledge 113 and contact pad 123 shown in FIG. 15A are substantially similar to the driver ledge 113 described with respect to FIG. 5B. Accordingly, substantially similar processing operations described above with respect FIGS. 6-10 can be used to provide a silicon substrate 101 having an array of LEDs 145 and an array of controller chips bonded to a front surface of the semiconductor substrate as shown in FIG. 15A. Referring now to FIG. 15B, the thickness of the silicon substrate 101 is reduced from the thickness $T_S$ to a final device thickness $T_D$. According to embodiments, the silicon substrate is reduced to a device thickness $T_D$ less than approximately 50 µm. As such, the substrate 101 is converted from a rigid state that it suitable for fabrication to a conformable state. According to an embodiment, the silicon substrate 101 is reduced to a device thickness $T_D$ less than 20 µm. In an embodiment, the silicon substrate 101 is reduced to a device thickness $T_D$ between 5 µm and 20 µm. Due to the presence of bank structures 102, the thickness of the substrate may be thinner in portions and have a minimum thickness $T_B$ below the bank structures. For example, thickness $T_B$ may be between 1 µm and 45 µm. Bank structures 102 are not required, however, and may not be present in other embodiments. According to an embodiment, the thickness of the silicon substrate is reduced with an etching process, a polishing process, or a combination of the two. In a particular embodiment, the silicon substrate 101 may first be polished to a thickness of approximately 100 µm, and thereafter etched to a thickness of less than 50 µm.

In an embodiment, an oxide layer 111, such as a $SiO_2$ layer, may be formed on the bottom surface of the substrate 101 after the thinning process. The oxide layer 111 may be deposited. For example, the oxide layer 111 may be deposited with PECVD or grown with wet thermal oxidation. According to an embodiment, the bottom oxide layer 111 may be a transparent or semi-transparent material. An oxide layer 111 improves the adhesion of a bottom passivation layer 162 that may be formed below the bottom surface of the silicon substrate 101. Materials such as, but not limited to, PDMS, PMMA, polyimide, and polyester may be used to form bottom passivation layer 162. In embodiments, a variety of methods including CVD or spin coating are used to form the bottom passivation layer. According to an embodiment, the bottom passivation layer 162 may be chosen to be the same material as the top passivation layer 160. According to an embodiment, a scratch resistant layer 164 may also be formed on the bottom passivation layer 162, as shown in FIG. 15B.

Figure 16A:
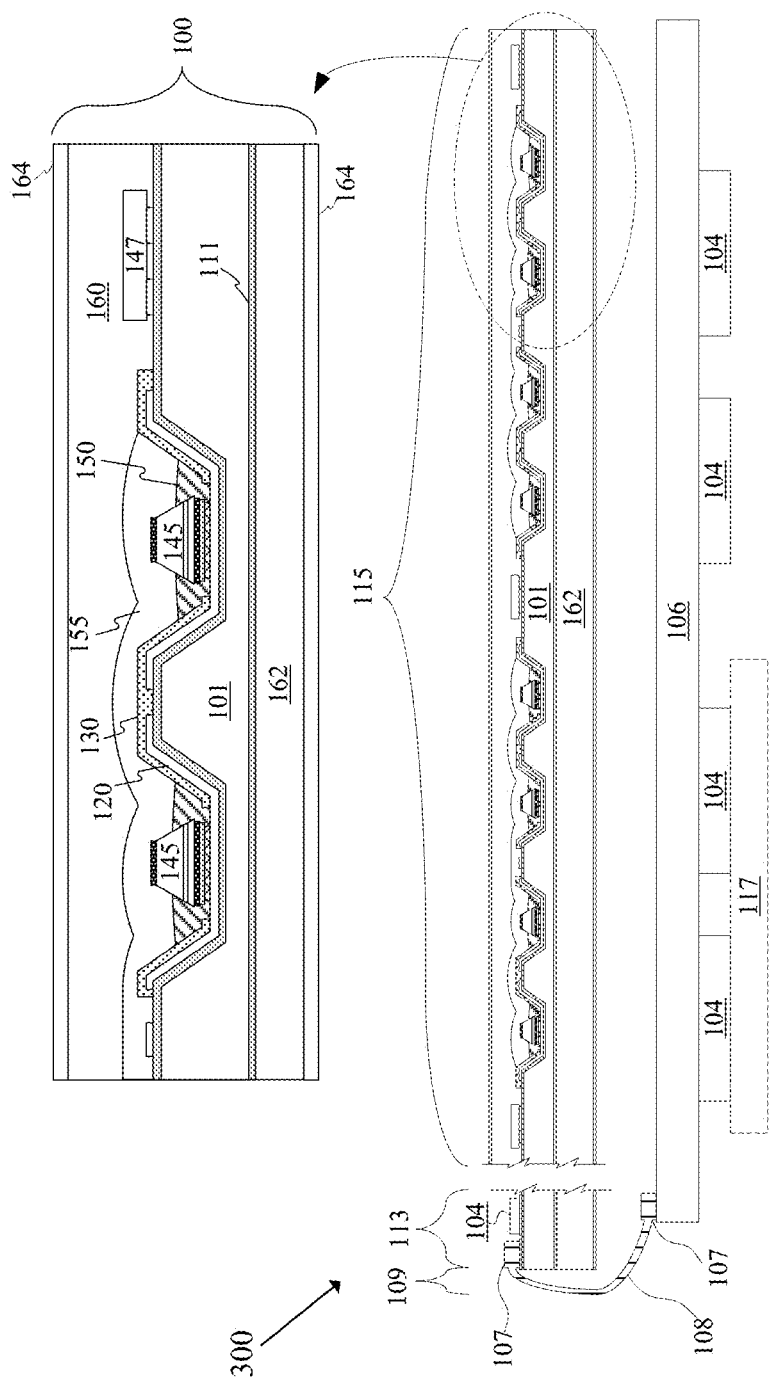
FIG. 16A is a cross-sectional side view illustration of a conformable electronic package in accordance with an embodiment.
Figure 16B:
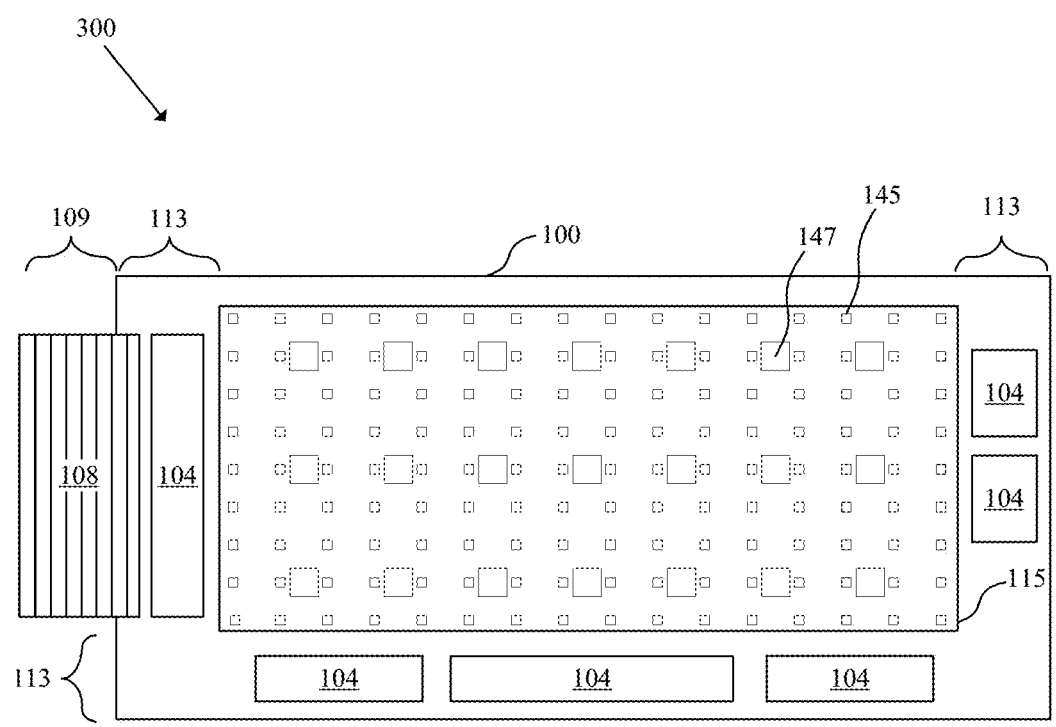
FIG. 16B is an overhead view illustration of the conformable electronic package of FIG. 16A in accordance with an embodiment.

In an embodiment, conformable electronic device 100 with a driver ledge 113 can be integrated into a conformable electronic package 300. FIGS. 16A-16B are exemplary (and not to scale) cross-sectional side view and front view illustrations of a conformable electronic package 300 according to an embodiment. As illustrated, conformable electronic package 300 includes a display area 115 and a driver ledge 113. In an embodiment, conformable electronic package 300 includes a conformable electronic device 100 connected to a printed circuit board (PCB) 106 by a flexible printed circuit (FPC) 108. A lateral extension length 109 of the FPC 108 may be associated with the FPC 108 of the conformable electronic package 300, even where the PCB 106 is wrapped behind the conformable electronic device 100 as shown. One or more display components 104 for operating the conformable electronic device 100 are mounted on the silicon substrate 101 on the driver ledge 113. For example, a scan driver and a data driver may be mounted on the driver ledge 113 on the silicon substrate 101. As shown in FIG. 16B, three peripheral regions of the conformable electronic device 100 include driver ledges 113, but embodiments are not so limited. By way of example, a driver ledge 113 may be formed on one, more than one, or all peripheral regions of the conformable electronic device 100. In an embodiment, additional devices and display components 104 for operating the conformable electronic device 100 are located off of the semiconductor substrate 101 on PCB 106. For example, display components 104 located off of the semiconductor substrate 101 can include driver ICs, such as a data driver and a scan driver, power management IC, processor, timing controller, touch sense IC, wireless controller, communications IC, etc. As illustrated, the PCB 106 is connected to the conformable electronic device 100 with FPC 108, with contact areas 107 of the FPC 108 bonded to surfaces of the conformable electronic device 100 and PCB 106. The PCB 106 may extend laterally from the silicon substrate 101, or alternatively can be wrapped behind the silicon substrate 101 as illustrated. As shown in FIG. 16A, one or more batteries 117 may also be located behind the silicon substrate 101 with the PCB 106.

While conformable electronic package 300 shown in FIGS. 16A and 16B is formed from a bulk silicon substrate 101 and with LEDs 145 integrated into bank structures 102, additional embodiments are not so limited. A substantially similar conformable electronic package 300 can be formed from a SOI such as the one described with respect to FIGS. 1B and 4B. Alternatively, a conformable electronic package 300 may optionally be formed without an array of bank structures 102.

Figure 17A:
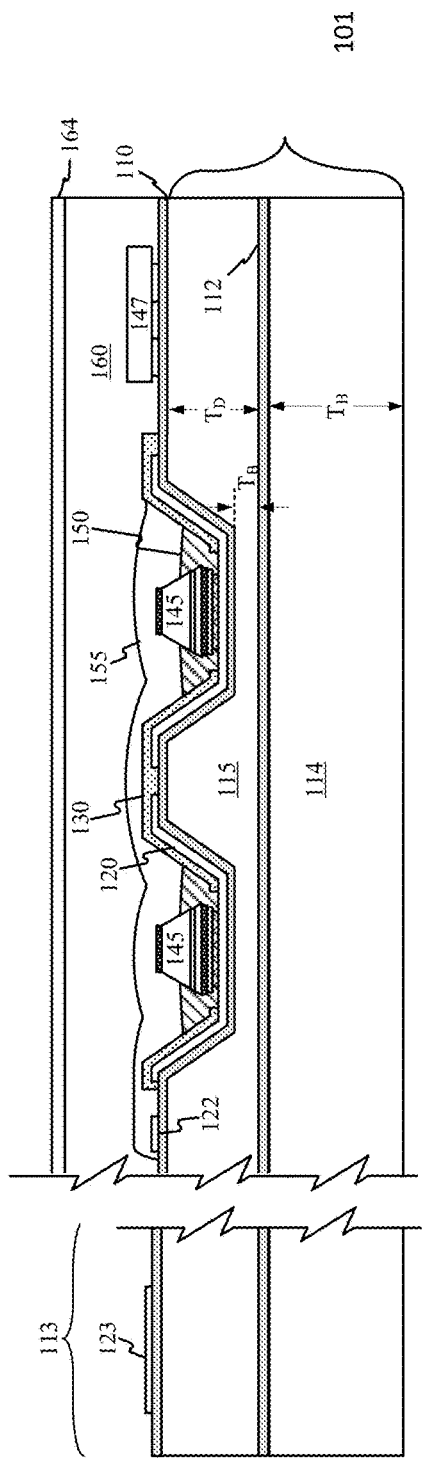
FIGS. 17A-18 are cross-sectional side view illustrations of conformable electronic devices in accordance with embodiments during various processing operations.
Figure 17B:
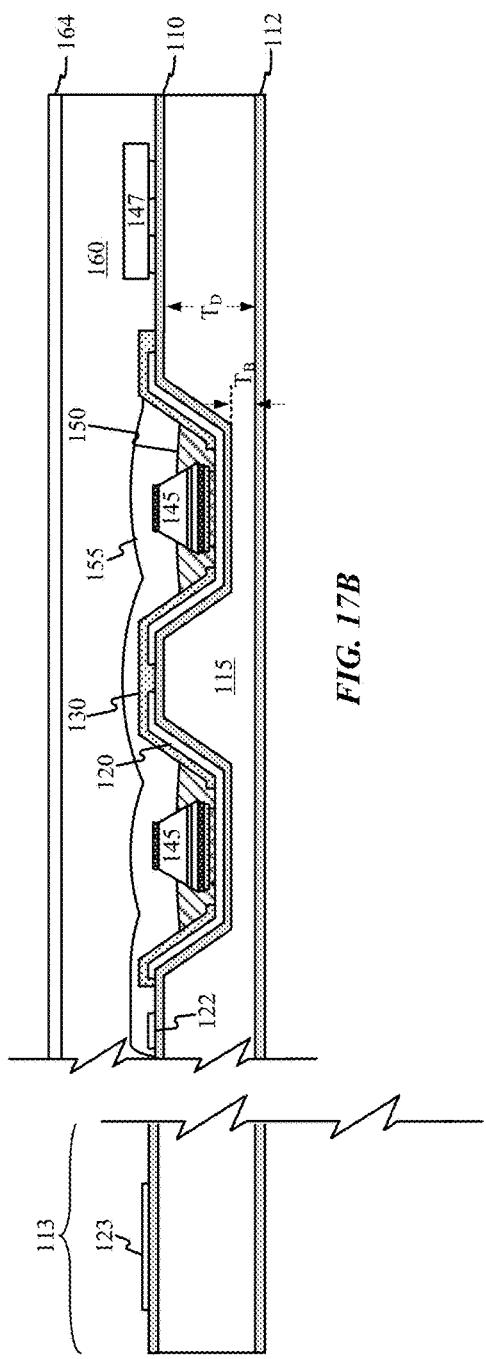
Figure 17C:
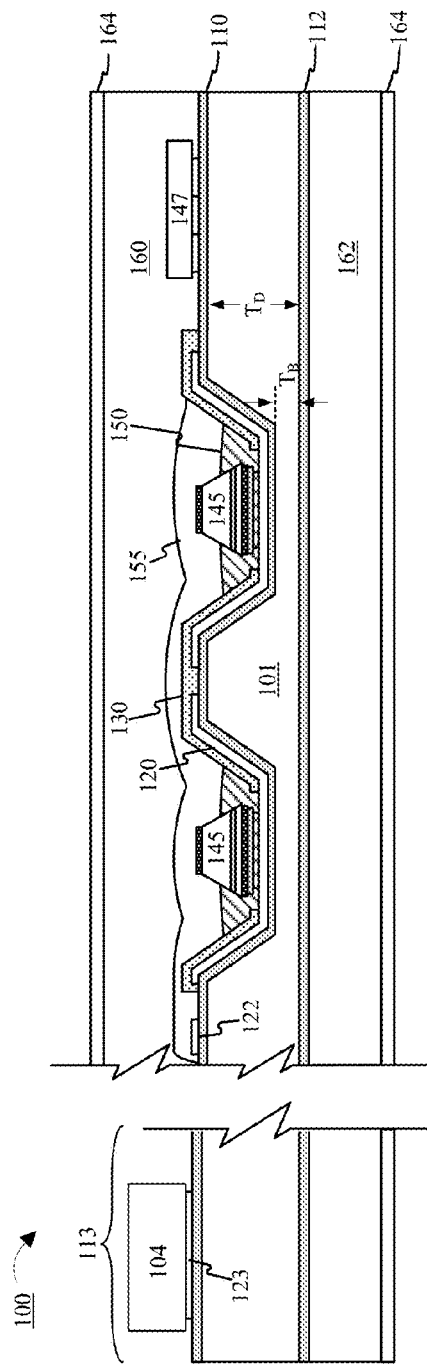

Referring now to FIGS. 17A-17C, a process for forming a conformable electronic package 300 from a SIO substrate 101 is shown. FIG. 17A is substantially similar to FIG. 15A, with the exception that substrate 101 is an SOI substrate including an upper silicon layer 115, a buried oxide layer 112, and a bulk silicon layer 114. As shown in FIG. 17B, the bulk silicon substrate 114 is removed. According to embodiments, the bulk silicon substrate 114 may be removed with an etching process, a polishing process, or a combination of the two. Furthermore, the buried oxide 112 may serve as an etch stop material and therefore, a greater degree of precision is available during the thinning process because over etching will not cause the substrate 101 to be etched too thin. According to embodiments, the buried oxide 112 provides an insulating layer and improves adhesion of subsequent layers to the conformable electronic device 100. In an embodiment, the buried oxide 112 may also be removed with an etching process, a polishing process, or a combination of the two.

Referring now to FIG. 17C, a bottom passivation layer 162 may be formed over the buried oxide 112. Materials such as, but not limited to, PDMS, PMMA, polyimide, and polyester may be used to form bottom passivation layer 162. In embodiments, a variety of methods including CVD, or spin coating are used to form the bottom passivation layer. According to an embodiment, the bottom passivation layer 162 may be chosen to be the same material as the top passivation layer 160. According to an embodiment, a scratch resistant layer 164 may also be formed on the bottom passivation layer 162, as shown in FIG. 17C. After the processing shown in FIG. 17C, the conformable electronic device may be integrated into a conformable package 300 substantially similar to the one described with respect to FIGS. 16A-16B by coupling one or more display components 104 to one or more contacts 123 on the driver ledge 113, or by connecting a PCB 106 to the conformable electronic device 100 with FPC 108. In an embodiment, driver ICs, such as a scan driver and a data driver, are bonded to one or more contacts 123 on the driver ledge 113, and additional display components 104 are bonded to a PCB 106 connected to a contact 123 on the driver ledge 113 with a FPC 108.

Figure 18:
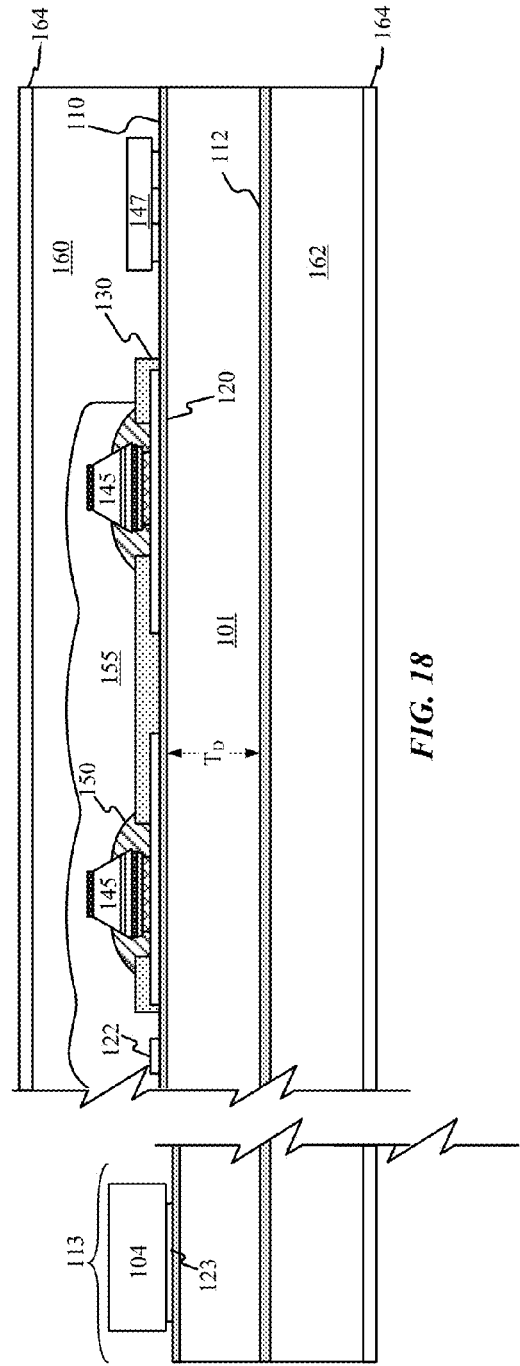

In an embodiment, a conformable electronic device 100 is formed with one or more driver ledges 113 with substantially the same process as described above, with the exception that the LEDs 145 are not integrated into bank structures 102. Such a conformable display 100 is shown in FIG. 18. According to an embodiment, a conformable electronic device without bank structures 102 may be integrated with into a conformable electronic package 300 substantially similar to the one described in FIGS. 16A-16B by coupling one or more display components 104 to one or more contacts 123 on the driver ledge 113, or by connecting a PCB 106 to the conformable electronic device 100 with FPC 108. In an embodiment, driver ICs, such as a scan driver and a data driver, are bonded to one or more contacts 123 on the driver ledge 113, and additional display components 104 are bonded to a PCB 106 connected to a contact 123 on the driver ledge with a FPC 108.

Figure 19:
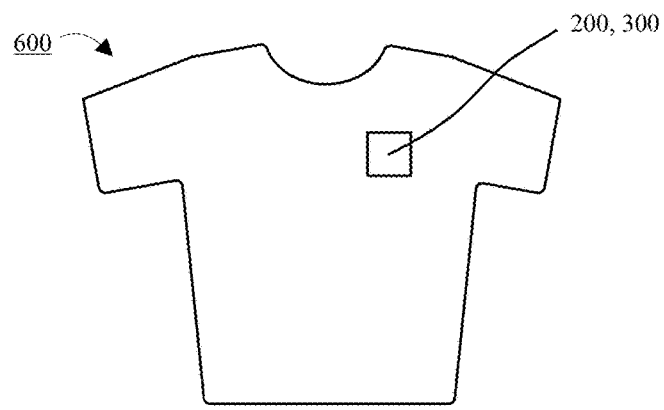
FIG. 19 is an illustration of a conformable electronic package that has been integrated into a flexible product according to an embodiment.

Referring now to FIG. 19, a conformable electronic package 200 or 300 may be integrated with a flexible surface 600. In an embodiment, a plurality of conformable electronic packages 200, 300 may be integrated with a flexible surface 600. By way of example, and not by way of limitation, the flexible surface 600 may be a textile, such as a t-shirt. In an embodiment, conformable electronic package 200, 300 is a patch that can be sewn onto other materials, such as clothing. Additional embodiments include other wearable flexible surfaces, such as wristbands, watches, hats, shoes, pants, shorts, gloves, etc. Conformable electronic packages 200, 300 that are integrated into wearable flexible products provide consumers and product designers with the ability to change designs, such as the logo displayed and color schemes. Embodiments also include flexible surfaces 600 that are a product packaging materials, such as a polymeric shrink wrapping material formed around a product. As such, manufacturers are able to update pricing, branding, or promotional materials displayed on the package without expensive repackaging costs. According to an embodiment the conformable electronic packages 200, 300 may be integrated into the flexible product by any suitable means, such as, for example, gluing conformable electronic packages 200, 300 to the flexible product 600 with an adhesive material.

Figure 20A:
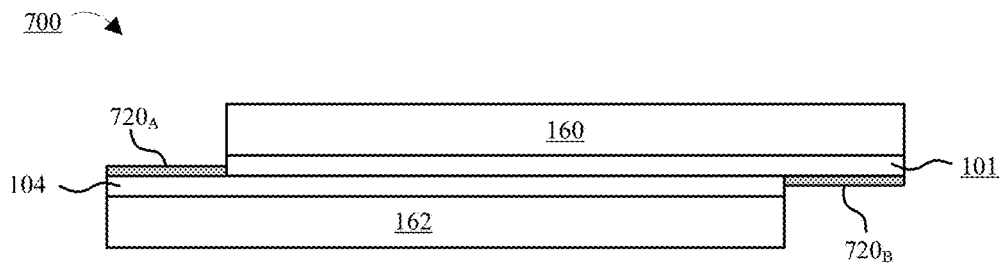
FIGS. 20A-20B are schematic cross-sectional side view illustrations of a conformable electronic package that has been integrated into a bracelet.
Figure 20B:
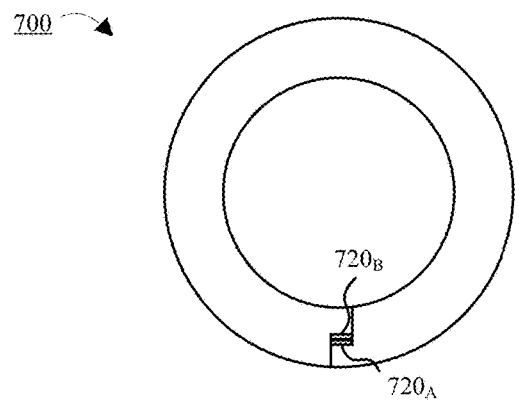

Referring now to FIGS. 20A and 20B, a schematic cross-sectional side view of a conformable electronic package that may be formed into a bracelet 700 is illustrated. As shown in the cross-sectional side views in FIG. 20A, magnets $720_A$ and $720_B$ may be formed along ledges of the package. By way of example, the ledges may be formed with a suitable etching process, such as plasma etching. In an embodiment, the magnets may be neodymium magnets. The conformable electronic package may then be rolled such that the two magnets contact each other and clasp the bracelet 700 together as illustrated in FIG. 20B.

It is also noted that embodiments are not limited to conformable display devices. Conformable electronic devices and processing methods similar to those described herein may also be used in the production of conformable sensors, chips, or other electronic devices. These additional conformable electronic devices may also be integrated into flexible products.

In utilizing the various aspects in the described embodiments, it would become apparent to one skilled in the art that combinations or variations of the above embodiments are possible for manufacturing or providing a conformable electronic device or a conformable electronic package. Although the present embodiments have been described in language specific to structural features and/or methodological acts, it is to be understood that the appended claims are not necessarily limited to the specific features or acts described. The specific features and acts disclosed are instead to be understood as implementations of the embodiments.

What is claimed is:

1. A display, comprising:
   a flexible substrate having first and second opposing surfaces and having a redistribution line on the second surface;
   an array of contact pads mounted to the first surface;
   an array of light-emitting elements, wherein each of the light-emitting elements is bonded to an associated one of the contact pads;
   a control circuit mounted to the first surface of the flexible substrate, wherein the control circuit is configured to switch and drive a light emitting element from the array of light emitting elements; and
   a conductive via in the flexible substrate that electrically connects the control circuit on the first surface of the substrate to the redistribution line on the second surface of the flexible substrate.

2. The display defined in claim 1, further comprising an electrically insulating material surrounding each of the light-emitting elements.

3. The display defined in claim 2, further comprising a conductive layer formed over the electrically insulating material, wherein the conductive layer is electrically connected to the array of light-emitting elements.

4. The display defined in claim 3, further comprising an additional conductive via in the flexible substrate that is electrically coupled to the conductive layer.

5. The display defined in claim 3, further comprising a passivation layer formed over the conductive layer.

6. The display defined in claim 5, further comprising a scratch resistant layer on the passivation layer.

7. The display defined in claim 5, further comprising an additional passivation layer on the second surface of the flexible substrate.

8. The display defined in claim 1, further comprising an oxide layer interposed between the second surface of the flexible substrate and the redistribution line.

9. The display defined in claim 1, wherein the array of light-emitting elements comprises an array of light-emitting diode pixels.

10. The display defined in claim 9, wherein the flexible substrate comprises an array of recesses and wherein each of the light-emitting diode pixels is mounted in an associated one of the recesses.

11. The display defined in claim 1, wherein the flexible substrate comprises silicon.

12. An electronic device, comprising:
a semiconductor substrate having first regions with a first thickness and a second region with a second thickness that is greater than the first thickness and having first and second opposing surfaces, and a redistribution line on the second surface;
an array of pixels on the first surface, wherein each of the pixels comprises a light-emitting diode mounted in an associated one of the first regions;
a controller chip bonded to the first surface and electrically coupled to the array of pixels; and
a via formed through the semiconductor substrate, wherein the via electrically couples the controller chip to the redistribution line on the second surface.

13. The electronic device defined in claim 12, wherein the first regions form an array of recesses in the first surface and wherein a height of each light-emitting diode is greater than a depth of each recess.

14. The electronic device defined in claim 13, wherein the depth of each recess is between 0.5 μm and 10 μm.

15. The electronic device defined in claim 12, wherein the semiconductor substrate comprises silicon.

16. The electronic device defined in claim 12, further comprising contact lines electrically connected to the array of pixels, wherein the first regions form an array of recesses in the first surface and wherein the contact lines extend into the recesses.

17. The electronic device defined in claim 12, further comprising an insulating layer having an array of openings, wherein each light-emitting diode is mounted to a contact pad in an associated one of the openings in the insulating layer.

18. A conformable display, comprising:
a substrate having first regions with a first thickness and second regions with a second thickness that is greater than the first thickness;
an array of light-emitting elements, wherein each light-emitting element is mounted to the substrate in an associated one of the first regions;
an array of control circuits, wherein each control circuit is mounted to the substrate in an associated one of the second regions; and
a conductive path that passes through the substrate, wherein the conductive path electrically couples an associated one of the control circuits on a first side of the substrate to a redistribution line on a second side of the substrate.

19. The conformable display defined in claim 18, wherein the first thickness is between 1 μm and 45 μm.

20. The conformable display defined in claim 19, wherein the second thickness is between 5 μm and 50 μm.

* * * * *